United States Patent
Bae et al.

(10) Patent No.: US 12,149,111 B2
(45) Date of Patent: *Nov. 19, 2024

(54) APPARATUS AND METHOD FOR CONTROLLING OPERATION OF SECONDARY BATTERY USING RELATIVE DETERIORATION DEGREE OF ELECTRODE

(71) Applicant: LG ENERGY SOLUTION, LTD., Seoul (KR)

(72) Inventors: Yoon-Jung Bae, Daejeon (KR); Ji-Yeon Kim, Daejeon (KR); Kyung-Hwa Woo, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,820

(22) Filed: Jan. 4, 2024

(65) Prior Publication Data

US 2024/0178687 A1    May 30, 2024

Related U.S. Application Data

(63) Continuation of application No. 17/612,015, filed as application No. PCT/KR2020/014620 on Oct. 23, 2020, now Pat. No. 11,942,810.

(30) Foreign Application Priority Data

Dec. 11, 2019    (KR) .................. 10-2019-0164888

(51) Int. Cl.
*H02J 7/00*    (2006.01)
*B60L 58/12*    (2019.01)
(Continued)

(52) U.S. Cl.
CPC .............. *H02J 7/005* (2020.01); *B60L 58/12* (2019.02); *B60L 58/16* (2019.02); *G01R 31/389* (2019.01);
(Continued)

(58) Field of Classification Search
CPC ...... H02J 7/005; H02J 7/0048; G01R 31/389; G01R 31/392; B60L 58/12; B60L 58/16;
(Continued)

(56) References Cited

U.S. PATENT DOCUMENTS 9,097,773 B2    8/2015   Joe et al.
2013/0099794 A1   4/2013   Takahashi et al.
(Continued)

FOREIGN PATENT DOCUMENTS

CN    108574317 A    9/2018
EP    3297121 A1    3/2018
(Continued)

OTHER PUBLICATIONS

International Search Report for PCTKR2020014620 dated Jan. 27, 2021, 2 pgs.
(Continued)

*Primary Examiner* — Nathaniel R Pelton
(74) *Attorney, Agent, or Firm* — Bryan Cave Leighton Paisner LLP

(57) ABSTRACT

Disclosed is an apparatus and method for controlling an operation of a secondary battery using a relative deterioration degree of an electrode. The method includes determining a SOC of the secondary battery whenever a pulse current flows through the secondary battery; determining an electrochemical reaction resistance from a voltage change amount measured during a preset initial time in each pulse current section and determining a lithium ion diffusion resistance from a voltage change amount measured during a
(Continued)

remaining time except for the initial time; determining a deterioration-biased electrode by comparing a deterioration diagnosing resistance ratio, which is a relative ratio of the lithium ion diffusion resistance to the electrochemical reaction resistance, with a preset reference deterioration diagnosing resistance ratio; and adaptively adjusting an operation condition of a next charging/discharging cycle according to the type of the deterioration-biased electrode.

22 Claims, 9 Drawing Sheets

(51) Int. Cl.
  *B60L 58/16* (2019.01)
  *G01R 31/389* (2019.01)
  *G01R 31/392* (2019.01)
  *H01M 10/42* (2006.01)
  *H01M 10/44* (2006.01)
  *H01M 10/48* (2006.01)

(52) U.S. Cl.
  CPC ........ *G01R 31/392* (2019.01); *H01M 10/425* (2013.01); *H01M 10/443* (2013.01); *H01M 10/486* (2013.01); *H02J 7/0048* (2020.01); *H01M 2010/4271* (2013.01); *H01M 2220/20* (2013.01)

(58) Field of Classification Search
  CPC ............. H01M 10/425; H01M 10/443; H01M 10/486; H01M 2010/4271; H01M 2220/20
  USPC ........................................................ 230/134
  See application file for complete search history.

(56) References Cited

U.S. PATENT DOCUMENTS

| | | | | |
|---|---|---|---|---|
| 2014/0222358 | A1* | 8/2014 | Morita | G01R 31/396 702/63 |
| 2015/0229150 | A1 | 8/2015 | Nakamori et al. | |
| 2016/0052419 | A1 | 2/2016 | Takahashi et al. | |
| 2016/0351974 | A1* | 12/2016 | Oniki | G01R 31/382 |
| 2018/0076633 | A1 | 3/2018 | Fujita et al. | |
| 2018/0246172 | A1 | 8/2018 | Abe et al. | |
| 2018/0261890 | A1 | 9/2018 | Yan et al. | |
| 2019/0079140 | A1* | 3/2019 | Matsuno | H02J 7/14 |
| 2019/0113577 | A1 | 4/2019 | Severson et al. | |
| 2020/0271727 | A1 | 8/2020 | Bae et al. | |

FOREIGN PATENT DOCUMENTS

| | | |
|---|---|---|
| JP | H11326471 A | 11/1999 |
| JP | 2003070169 A | 3/2003 |
| JP | 2004327338 A | 11/2004 |
| JP | 2007-187533 A | 7/2007 |
| JP | 2008-41565 A | 2/2008 |
| JP | 2011-54542 A | 3/2011 |
| JP | 2014044149 A | 3/2014 |
| JP | 2014-126411 A | 7/2014 |
| JP | 5537236 B2 | 7/2014 |
| JP | 2015-122910 A | 7/2015 |
| JP | 6239241 B2 | 11/2017 |
| JP | 2018046667 A | 3/2018 |
| JP | 2019113524 A | 7/2019 |
| JP | 6567616 B2 | 8/2019 |
| KR | 101487494 B1 | 1/2015 |
| KR | 101504804 B1 | 3/2015 |
| KR | 20160140439 A | 12/2016 |
| KR | 20170045730 A | 4/2017 |
| KR | 20190118535 A | 10/2019 |
| WO | 2014/167602 A1 | 10/2014 |
| WO | 2016/059869 A1 | 4/2016 |
| WO | 2019013536 A1 | 1/2019 |

OTHER PUBLICATIONS

Plett, G.L., "Extended Kalman filtering for battery management systems of LiPB-based HEV battery packs, Part 1. Background", "Journal of Power Sources", Jun. 2004, pp. 252-261, vol. 134, ELSEVIER, Colorado.

Plett, G.L., "Extended Kalman filtering for battery management systems of LiPB-based HEV battery packs, Part 2. Modeling and identification", "Journal of Power Sources", May 2004, pp. 262-276, vol. 134, ELSEVIER, Colorado.

Plett, G.L., "Extended Kalman filtering for battery management systems of LiPB-based HEV battery packs, Part 3. State and parameter estimation", "Journal of Power Sources", May 2004, pp. 277-292, vol. 134, ELSEVIER, Colorado.

* cited by examiner

ÅPPARATUS AND METHOD FOR
CONTROLLING OPERATION OF
SECONDARY BATTERY USING RELATIVE
DETERIORATION DEGREE OF
ELECTRODE

CROSS-REFERENCE TO RELATED
APPLICATIONS

This application is a Continuation of U.S. patent application Ser. No. 17/612,015, filed Nov. 17, 2021, which is a National phase entry under 35 U.S.C. § 371 of International Application No. PCT/KR2020/014620, filed Oct. 23, 2020, which claims priority to Korean Patent Application No. 10-2019-0164888, filed Dec. 11, 2019, all of which are incorporated herein by reference.

TECHNICAL FIELD

The present disclosure relates to an apparatus and method for controlling an operation of a secondary battery, and more particularly, to an apparatus and method for controlling an operation of a secondary battery, which may adaptively adjust a charging/discharging operation condition according to an electrode having a relatively large deterioration degree out of a positive electrode and a negative electrode of a secondary battery.

BACKGROUND ART

The application field of secondary batteries is gradually increasing not only to mobile devices such as cellular phones, laptop computers, smart phones and smart pads, but also electric-driven vehicles (EVs, hybrid EVs (HEVs), plug-in HEVs (PHEVs)), large-capacity energy storage systems (ESS), or the like.

The deterioration degree of the secondary battery increases as the charging/discharging cycle increases. The deterioration degree may be calculated based on an increase in resistance or a decrease in capacity of the secondary battery.

The deterioration degree is numerically expressed as a parameter, called SOH (State of Health), in consideration of the resistance or capacity of the secondary battery.

For example, when the resistance of a secondary battery in a BOL (Beginning Of Life) state is defined as $R_{BOL}$ and the resistance of a secondary battery in a MOL (Middle Of Life) state, namely in a present state where the charging/discharging cycle increases, is defined as $R_{MOL}$, SOH using resistance may be expressed as $R_{BOL}/R_{MOL}$.

In addition, when the capacity of a secondary battery in a BOL (Beginning Of Life) state is defined as $C_{BOL}$ and the capacity of a secondary battery in a MOL (Middle Of Life) state, namely in a present state where the charging/discharging cycle increases, is defined as $C_{MOL}$, SOH using capacity may be defined as $C_{MOL}/C_{BOL}$.

The secondary battery may deteriorate due to irreversible loss of working ions (lithium ions in the case of a lithium secondary battery) causing an electrochemical reaction, damage to the structure of an active material, precipitation of working ions, increased side reactions of the electrolyte, and the like.

The deterioration degree of the secondary battery corresponds to the quantitative sum of a deterioration degree of a positive electrode and a deterioration degree of a negative electrode. In case of a secondary battery in a BOL state or with small charging/discharging cycles, the positive electrode and the negative electrode have almost the same deterioration degree. However, in a secondary battery in a MOL state, the deterioration degrees of the positive electrode and the negative electrode shows a relative deviation. This is because the mechanism of deterioration of the positive electrode and the negative electrode differs depending on the type of active material coated on a current collector.

Typically, the charging/discharging operation condition of the secondary battery is adaptively adjusted according to the deterioration degree of the secondary battery. For example, if the deterioration degree increases, the charging cutoff voltage is decreased or the charging C-rate set for each SOC (State Of Charge) is decreased.

However, the point of control of the charging/discharging operation condition needs to be changed according to the type of an electrode whose deterioration degree is relatively increased larger out of the positive electrode and the negative electrode.

For example, if the positive electrode is more degraded than the negative electrode, structural damage of the positive electrode active material is accelerated near the end of the charging section, so the charging control should be focused on reducing the charging cutoff voltage and reducing the charging C-rate at the end of the charging section.

Meanwhile, if the negative electrode is more degraded than the positive electrode, it is more important to prevent the precipitation of working ions generated on the surface of the negative electrode rather than damage to the structure of the negative electrode active material. Therefore, the charging control should be focused on adjusting the rest time before starting charging and reducing the C-rate of the charging current in a charging section where precipitation of working ions is expected.

However, in the prior art, there is no technical alternative to adaptively controlling the charging/discharging operation conditions according to the type of an electrode having a relatively large deterioration degree.

SUMMARY

Technical Problem

The present disclosure is designed to solve the problems of the related art, and therefore the present disclosure is directed to providing an apparatus and method for controlling an operation of a secondary battery, which may identify the type of an electrode having a relatively large deterioration degree out of a positive electrode and a negative electrode of a secondary battery in a MOL state and adaptively control a charging/discharging operation condition in consideration of electrochemical characteristics of the corresponding electrode.

Technical Solution

In one aspect of the present disclosure, there is provided an apparatus for controlling an operation of a secondary battery using a relative deterioration degree of an electrode, comprising: a sensor unit configured to measure an operation characteristic value including voltage, current and temperature of the secondary battery; and a control unit operatively coupled to the sensor unit.

Preferably, the control unit may be configured to: receive the measured voltage, current and temperature of the secondary battery from the sensor unit, determine a State Of Charge (SOC) of the secondary battery based on the measured voltage, current and temperature of the secondary battery in response to a pulse current flowing through the secondary battery in a preset deterioration diagnosing SOC section, wherein the pulse current includes each of a charging/discharging section and a rest section; determine an electrochemical reaction resistance from a voltage change amount measured during a preset initial time in each section of the pulse current and determine an ion diffusion resistance from a voltage change amount measured during a remaining time in each section of the pulse current excluding the initial time, determine a deterioration-biased electrode by comparing a deterioration diagnosing resistance ratio, which is a ratio of the ion diffusion resistance to the electrochemical reaction resistance, with a preset reference deterioration diagnosing resistance ratio, and adaptively adjust an operation condition of a next charging/discharging cycle according to the determined deterioration-biased electrode.

In an example, the preset initial time in each pulse current section may be 0.1 msec to 1 sec.

According to an embodiment, according to the determined SOC of the secondary battery, an OCV profile of a negative electrode of the secondary battery may have a flat section, and the deterioration diagnosing SOC section may correspond to the flat section.

In this case, the control unit may be configured to: determine that a positive electrode of the secondary battery is the deterioration-biased electrode in response to an average value of the deterioration diagnosing resistance ratio calculated in the deterioration diagnosing SOC section being greater than an average value of the reference deterioration diagnosing resistance ratio, and determine that the negative electrode of the secondary battery is the deterioration-biased electrode in response to the average value of the deterioration diagnosing resistance ratio calculated in the deterioration diagnosing SOC section being smaller than the average value of the reference deterioration diagnosing resistance ratio.

As an alternative, the control unit may be configured to: determine that a positive electrode of the secondary battery is the deterioration-biased electrode in response to a ratio of a section of the deterioration diagnosing SOC section for which the deterioration diagnosing resistance ratio is greater than the reference deterioration diagnosing resistance ratio being equal to or greater than a threshold value, and determine that the negative electrode of the secondary battery is the deterioration-biased electrode in response to a ratio of a section of the deterioration diagnosing SOC section for which the deterioration diagnosing resistance ratio is smaller than the reference deterioration diagnosing resistance ratio being equal to or greater than the threshold value.

According to another embodiment, according to the determined SOC of the secondary battery, an OCV profile of a positive electrode of the secondary battery may have a flat section, and the deterioration diagnosing SOC section may correspond to the flat section.

In this case, the control unit may be configured to: determine that a negative electrode of the secondary battery is the deterioration-biased electrode in response to an average value of the deterioration diagnosing resistance ratio calculated in the deterioration diagnosing SOC section being greater than an average value of the reference deterioration diagnosing resistance ratio, and determine that the positive electrode of the secondary battery is the deterioration-biased electrode in response to the average value of the deterioration diagnosing resistance ratio calculated in the deterioration diagnosing SOC section being smaller than the average value of the reference deterioration diagnosing resistance ratio.

As an alternative, the control unit may be configured to: determine that negative electrode of the secondary battery is the deterioration-biased electrode in response to a ratio of a section of the deterioration diagnosing SOC section for which the deterioration diagnosing resistance ratio is greater than the reference deterioration diagnosing resistance ratio being equal to or greater than a threshold value, and determine that the positive electrode of the secondary battery is the deterioration-biased electrode in response to a ratio of a section of the deterioration diagnosing SOC section for which the deterioration diagnosing resistance ratio is smaller than the reference deterioration diagnosing resistance ratio being equal to or greater than the threshold value.

Preferably, in response to the deterioration-biased electrode being a positive electrode, the control unit may be configured to adjust at least one operation condition selected from a charging cutoff voltage, a discharging cutoff voltage, a rest section of the pulse current or a C-rate of the pulse current according to a deviation between: (i) an average value of the deterioration diagnosing resistance ratio determined for each SOC determined in response to the pulse current flowing through the secondary battery in the preset deterioration diagnosing SOC section; and (ii) an average value of the reference deterioration diagnosing resistance ratio preset for each SOC.

Preferably, in response to the deterioration-biased electrode being a negative electrode, the control unit may be configured to adjust the at least one operation condition selected from the charging cutoff voltage, the discharging cutoff voltage, the rest section of the pulse current or the C-rate of the pulse current according to the deviation between the average value of the deterioration diagnosing resistance ratio determined for each SOC determined in response to the pulse current flowing through the secondary battery in the preset deterioration diagnosing SOC section; and (ii) the average value of the reference deterioration diagnosing resistance ratio preset for each SOC.

In another aspect of the present disclosure, there is also provided a battery management system or an electric driving mechanism, comprising the apparatus for controlling an operation of a secondary battery using a relative deterioration degree of an electrode as described in any of the embodiments herein.

In another aspect of the present disclosure, there is also provided a method for controlling an operation of a secondary battery using a relative deterioration degree of an electrode, comprising: (a) measuring voltage, current and temperature of the secondary battery; (b) determining an SOC of the secondary battery based on the measured voltage, current and temperature of the secondary battery in response to a pulse current flowing through the secondary battery in a preset deterioration diagnosing SOC section; (c) determining an electrochemical reaction resistance from a voltage change amount measured during a preset initial time in each section of the pulse current and determining an ion diffusion resistance from a voltage change amount measured during a remaining time in each section of the pulse current excluding the initial time; (d) determining a deterioration-biased electrode by comparing a deterioration diagnosing resistance ratio, which is a ratio of the ion diffusion resistance to the electrochemical reaction resistance, with a preset reference deterioration diagnosing resistance ratio; and (e) adaptively adjusting an operation condition of a next charging/discharging cycle according to the determined deterioration-biased electrode.

Advantageous Effects

According to the present disclosure, it is possible to identify the type of an electrode having a relatively large deterioration degree out of a positive electrode and a negative electrode of a secondary battery in a MOL state and adaptively control a charging/discharging operation condition in consideration of electrochemical characteristics of the corresponding electrode.

Accordingly, it is possible to safely control the operation of the secondary battery in a MOL state as compared to the prior art that adjusts the charging/discharging operation condition in consideration of the deterioration degree of the entire secondary battery.

In addition, since the charging/discharging operation condition is adaptively controlled by focusing on the electrode having a relatively large deterioration degree, the deterioration degree increase rate of the secondary battery may be reduced so that the life of the secondary battery is increased as much.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is deemed that a detailed description of a related known configuration or function may obscure the subject matter of the present disclosure, the detailed description will be omitted.

Unless the context clearly indicates otherwise, it will be understood that the term "comprises" when used in this specification, specifies the presence of stated elements, but does not preclude the presence or addition of one or more other elements.

Additionally, the term such as "processor" or "control unit" as used herein refers to a processing unit executing at least one function or operation, and this may be implemented by hardware and software either alone or in combination.

In addition, throughout the specification, it will be further understood that when an element is referred to as being "connected to" another element, it can be directly connected to the other element or intervening elements may be present.

In this specification, a secondary battery includes a negative electrode terminal and a positive electrode terminal and may refer to one independent cell that can be physically separated.

For example, a pouch-type lithium secondary battery may be regarded as a secondary battery. In addition, the secondary battery may refer to an assembly of cells connected in series and/or in parallel. For example, a module or pack in which a plurality of lithium secondary batteries are connected in series and/or in parallel suitable for a design capacity may be regarded as a secondary battery.

Figure 1:
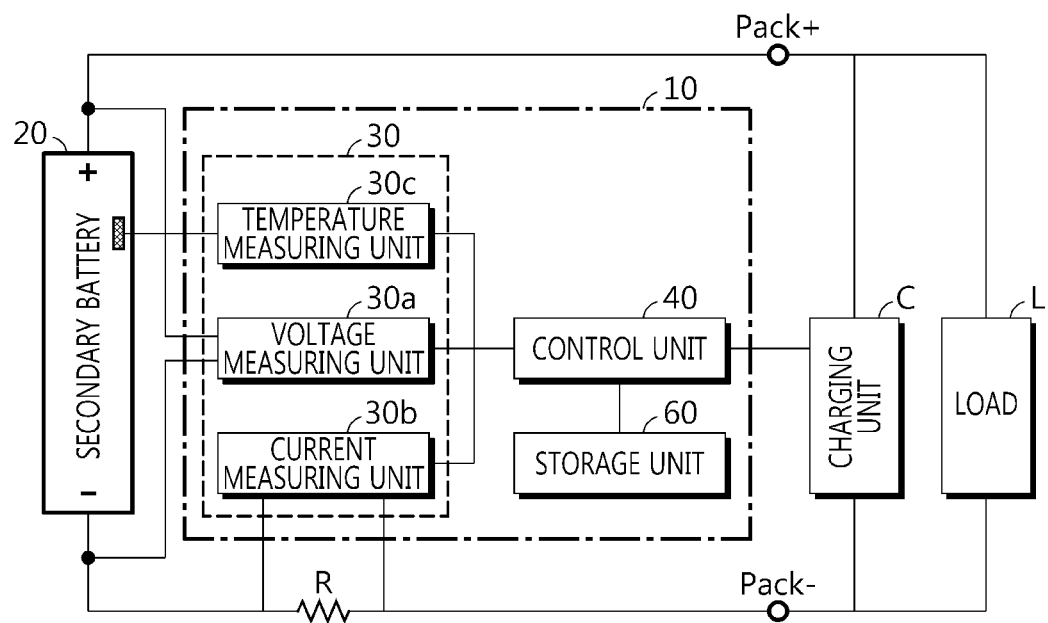
FIG. 1 is a block diagram showing an apparatus for controlling an operation of a secondary battery using a relative deterioration degree of an electrode according to an embodiment of the present disclosure.

FIG. 1 is a block diagram showing an apparatus for controlling an operation of a secondary battery using a relative deterioration degree of an electrode according to an embodiment of the present disclosure.

Referring to FIG. 1, an apparatus 10 for controlling an operation of a secondary battery using a relative deterioration degree of an electrode according to the embodiment of the present disclosure is coupled to a secondary battery 20 to identify the type of an electrode having a relatively large deterioration degree out of a positive electrode and a negative electrodes of the secondary battery 20 in a MOL state and adaptively control a charging/discharging operation condition according to the type of the identified electrode.

The apparatus 10 for controlling an operation of a secondary battery according to the present disclosure includes a sensor unit 30 for measuring an operation characteristic value of the secondary battery while the secondary battery 20 is being charged or discharged, a control unit 40 for identifying a deterioration-biased electrode having a relatively large deterioration degree out of a positive electrode and a negative electrode of the secondary battery 20 and adaptively controlling a charging/discharging operation condition of the secondary battery 20 according to the type of the deterioration-biased electrode, and a storage unit 60 for storing operation characteristic values of the secondary battery 20, programs necessary for executing control logics, data derived while executing the control logics, predefined parameters, and the like.

Preferably, the sensor unit 30 includes a voltage measuring unit 30a, a current measuring unit 30b and a temperature measuring unit 30c, and measures voltage, current and temperature of the secondary battery 20 under the control of the control unit 40 while the secondary battery 20 is operating.

The voltage measuring unit 30a periodically measures a voltage between the positive electrode and the negative electrode of the secondary battery 20 according to the request of the control unit 40, and outputs the measured voltage value to the control unit 40. Then, the control unit 40 receives the measured voltage value and records the same in the storage unit 60.

The voltage measuring unit 30a may include a floating capacitor for charging and holding the voltage of the secondary battery 20, a voltage sensing circuit for measuring the voltage of the secondary battery 20 charged and held in the floating capacitor, and the like, but the present disclosure is limited thereto.

When the secondary battery 20 includes a plurality of cells connected in series, the design of the voltage measuring unit 30a may be changed to simultaneously or time-differentially measure the terminal voltage of the plurality of cells. Since the technology for measuring the voltage for a plurality of cells is widely known in the art, it will not be described in detail here.

The current measuring unit 30b periodically measures a current flowing through the secondary battery 20 according to the request of the control unit 40 and outputs the measured current value to the control unit 40. The current flowing through the secondary battery 20 is a charging current or a discharging current.

The current measuring unit 30b measures the voltage applied to both ends of a sense resistor R when a current flows through the secondary battery 20 and outputs the same to the control unit 40. The voltage at both ends of the sense resistor R corresponds to the measured current value. The control unit 40 may convert the voltage value at both ends of the sense resistor R into a measured current value using Ohm's law (V=IR). The current measuring unit 30b may be replaced by another known current sensor such as a Hall sensor.

The temperature measuring unit 30c periodically measures a temperature of the secondary battery 20 according to the request of the control unit 40 and outputs the measured temperature value to the control unit 40.

The temperature measuring unit 30c may be a temperature sensor known in the art, such as a thermocouple, but the present disclosure is not limited thereto.

According to an embodiment, the apparatus 10 for controlling an operation of a secondary battery may be operatively coupled to a charging unit C. The charging unit C applies a charging current to the secondary battery 20 according to a preset charging protocol according to the request of the control unit 40.

Preferably, the charging current is a constant current or a pulse current. The pulse current is a charging current in which a charging section where a DC current is applied to the secondary battery 20 and a rest section where a DC current is not applied to the secondary battery 20 are repeated.

The charging unit C may vary depending on a device to which the secondary battery 20 is mounted.

For example, if the secondary battery 20 is mounted to an electric vehicle, the charging unit C may be a charging station for the electric vehicle.

As another example, if the secondary battery 20 is mounted to an electric vehicle or a hybrid electric vehicle, the charging unit C may be a regeneration charging unit that provides a charging power during a deceleration process of the vehicle.

As still another example, if the secondary battery 20 is mounted to a mobile terminal such as a smartphone or a laptop computer, the charging unit C may be a charging circuit provided in the corresponding terminal.

Preferably, the charging unit C may be coupled with a control system (not shown) that adjusts the charging current applied to the secondary battery 20 according to the request of the control unit 40.

A load L is an element that receives a discharging current from the secondary battery 20. The load L may be an inverter coupled to a motor of an electric-driven vehicle, a DC/DC converter electrically coupled to an electric component of an electric-driven vehicle, a power conversion circuit for supplying a power to a circuit of a mobile terminal, or the like. However, the present disclosure is not limited thereto.

Preferably, the discharging current is a constant current or a pulse current. The pulse current is a discharging current in which a discharge section where a DC current is applied to the load L and a rest section where a DC current is not applied to the load L are repeated.

The control unit 40 may be electrically operatively coupled to the charging unit C. In addition, the control unit 40 may adaptively change a charging operation condition such as the type of the charging current supplied to the secondary battery 20 (a pulse current or a constant current), a C-rate of the charging current, a duty ratio and a duration by controlling the charging unit C when the secondary battery 20 is charged.

The control unit 40 is also electrically operatively coupled to the load L. In this case, the control unit 40 may control the discharging of the secondary battery 20 to apply a discharging current to the load L. A load management system (not shown) that manages the control of the load L may receive information about an available discharging output from the control unit 40 and control the power consumed by the load L within the range of the available discharging output.

In addition, the control unit 40 may adaptively change a discharging operation condition such as the type of the discharging current (a pulse current or a constant current) supplied from the secondary battery 20 to the load L, a C-rate of the discharging current, a duty ratio and a duration by controlling the load management system (not shown) when the secondary battery 20 is discharged.

The control unit 40 may be connected with the control system of the charging unit C and the load management system through a communication line, and may exchange a command message required to control charging and discharging of the secondary battery 20 with the control system of the charging unit C and the load management system by means of communication.

The control unit 40 may calculate an electrochemical reaction resistance and an ion diffusion resistance of the secondary battery 20 in a deterioration diagnosing SOC section while the secondary battery 20 is being charged or discharged, and determine an electrode having a relatively large deterioration degree out of the electrodes of the secondary battery 20 in consideration of a relative ratio of the ion diffusion resistance to the electrochemical reaction resistance.

Hereinafter, the electrochemical reaction resistance is represented by $R_{t1}$ and the ion diffusion resistance is represented by $R_{t2}$. In addition, $R_{t1,k}$ is used when representing a plurality of electrochemical reaction resistance, and $R_{t2,k}$ is used when representing a plurality of ion diffusion resistance. Here, k is a natural number of 1 to n.

The deterioration diagnosing SOC section refers to a SOC section preset to identify the type of an electrode having a relatively large deterioration degree out of the positive electrode and the negative electrode of the secondary battery 20 while the secondary battery 20 is being charged or discharged.

In the present disclosure, the electrode having a relatively large deterioration degree is called a deterioration-biased electrode, and the deterioration-biased electrode may be any one out of a positive electrode and a negative electrode.

Preferably, an OCV profile of the negative electrode or the positive electrode according to the SOC of the secondary battery 20 has a flat section, and the deterioration diagnosing SOC section corresponds to the flat section of the OCV profile.

Preferably, the secondary battery is a lithium secondary battery. Also, the positive electrode may include $Li_{1+a}Ni_xCo_yMn_zO_2$ ($0 \leq a \leq 0.2$, $0 \leq x,y,z \leq 1$) as an active material, and the negative electrode may include graphite, LTO ($LiTiO_2$) or LFP ($LiFePO_4$) as an active material. However, the present disclosure is not limited by the types of the positive electrode active material and the negative electrode active material.

Figure 2:
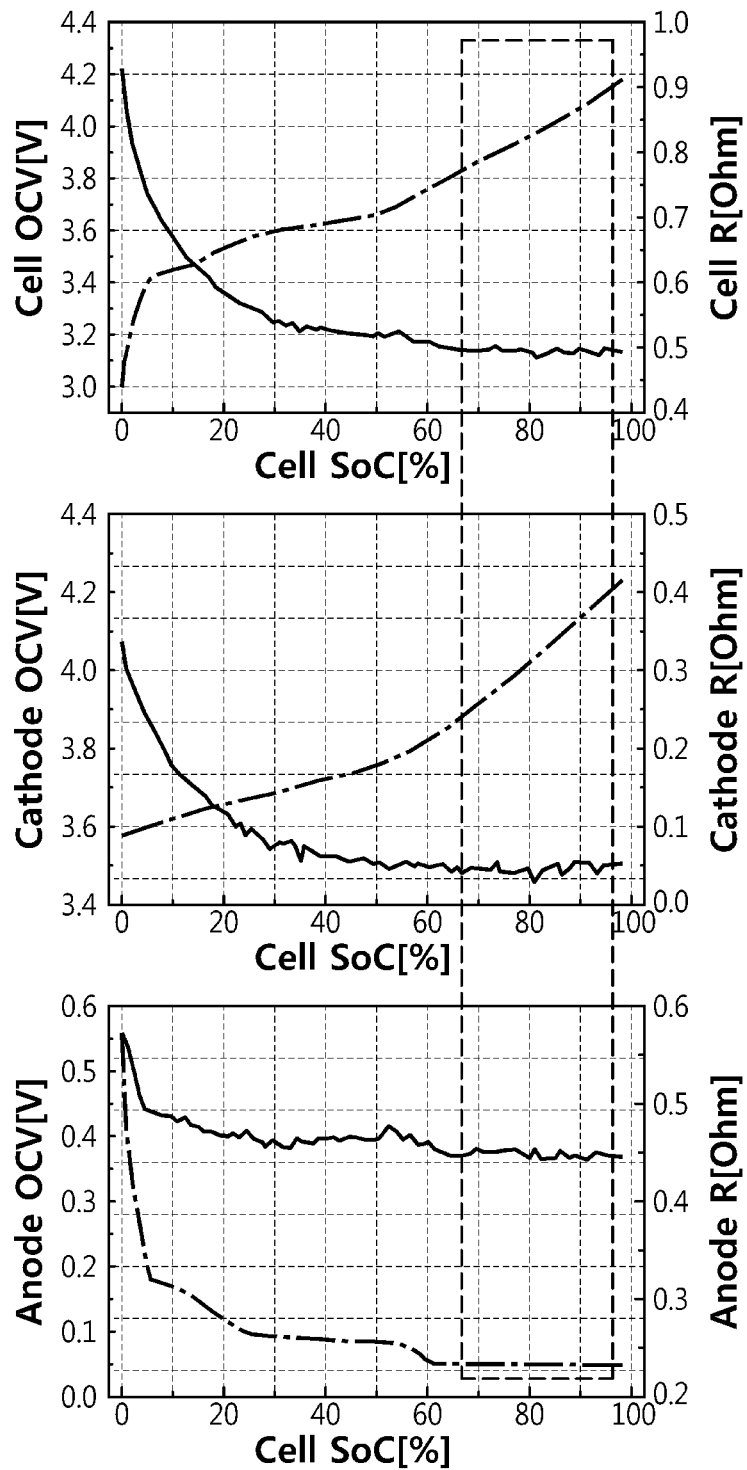
FIG. 2 are graphs showing a cell OCV profile, a positive electrode (cathode) OCV profile and a negative electrode (anode) OCV profile of a lithium secondary battery that includes $Li_aNi_xCo_yMn_zO_2$, which is a lithium transition metal oxide, as an active material in a positive electrode and includes graphite as an active material in a negative electrode.

FIG. 2 are graphs showing a cell OCV profile, a positive electrode OCV profile and a negative electrode OCV profile of a lithium secondary battery that includes $Li_aNi_xCo_yMn_zO_2$, which is a lithium transition metal oxide, as an active material in a positive electrode and includes graphite as an active material in a negative electrode. A dashed-dotted line profile represents an OCV profile, and a solid line profile represents a resistance profile.

In an embodiment, the lithium secondary battery is a pouch-type lithium polymer cell, and the operating voltage range is 3.0 to 4.2V. The electrolyte of the lithium secondary battery includes a solvent and a lithium salt. The solvent includes EC (Ethylene Carbonate) and EMC (Ethyl Methyl Carbonate) in a weight ratio of 3:7. The lithium salt is $LiPF_6$ with a concentration of 1 mol.

The cell OCV profile shown in FIG. 2 is created based on OCV data for each SOC obtained through a full charging experiment for a lithium secondary battery in a BOL state.

In addition, a positive electrode OCV profile and a negative electrode OCV profile are measured simultaneously when measuring the cell OCV profile using a reference electrode inserted in the lithium secondary battery.

Referring to FIG. 2, the positive electrode OCV profile has a pattern in which OCV increases as the SOC of the lithium secondary battery increases, and the negative electrode OCV profile has a flat section in which the OCV is kept constant when the SOC is 67% to 97% while the OCV is decreasing as the SOC of the lithium secondary battery increases.

Therefore, for the lithium secondary battery according to the embodiment, the flat section in the SOC section of 67% to 97% may be set in advance as a deterioration diagnosing SOC section.

In the present disclosure, since the deterioration diagnosing SOC section is changed according to the type of the active materials included in the positive electrode and the negative electrode, it is obvious to those skilled in the art that the deterioration diagnosing SOC section is not limited to the numerical range suggested in the embodiment.

According to the present disclosure, the electrochemical reaction resistance $R_{t1}$ refers to an electrical resistance involved in the process where lithium ions are inserted into active material particles by causing an electrochemical reaction on the surface of the active material particles.

In addition, the ion diffusion resistance $R_{t2}$ refers to an electrical resistance involved in the process where lithium ions are diffused into the active material particles after being inserted into the active material particles by an electrochemical reaction.

For reference, when the secondary battery 20 is charged, the active material particles into which lithium ions are inserted are negative electrode active materials, and when the secondary battery 20 is discharged, the active material particles into which lithium ions are inserted are positive electrode active materials.

The electrochemical reaction resistance Ru may be determined as follows. After allowing a pulse current to flow through the secondary battery 20 during an electrochemical reaction time required for the electrochemical reaction of lithium ions, a voltage change amount of the secondary battery 20 is measured according to the flow of pulse current and the electrochemical reaction resistance $R_{t1}$ may be determined from the measured voltage change amount and the magnitude of the pulse current using Ohm's law.

In addition, the ion diffusion resistance $R_{t2}$ may be determined as follows. After allowing a pulse current to flow through the secondary battery 20 for a time during which lithium ions can be inserted into the active material particles after an electrochemical reaction and then diffuse inside the active material particles, a voltage change amount of the secondary battery 20 is measured according to the flow pulse current, the ion diffusion resistance $R_{t2}$ may be determined from the measured voltage change amount and the magnitude of the pulse current using Ohm's law.

Figure 3:
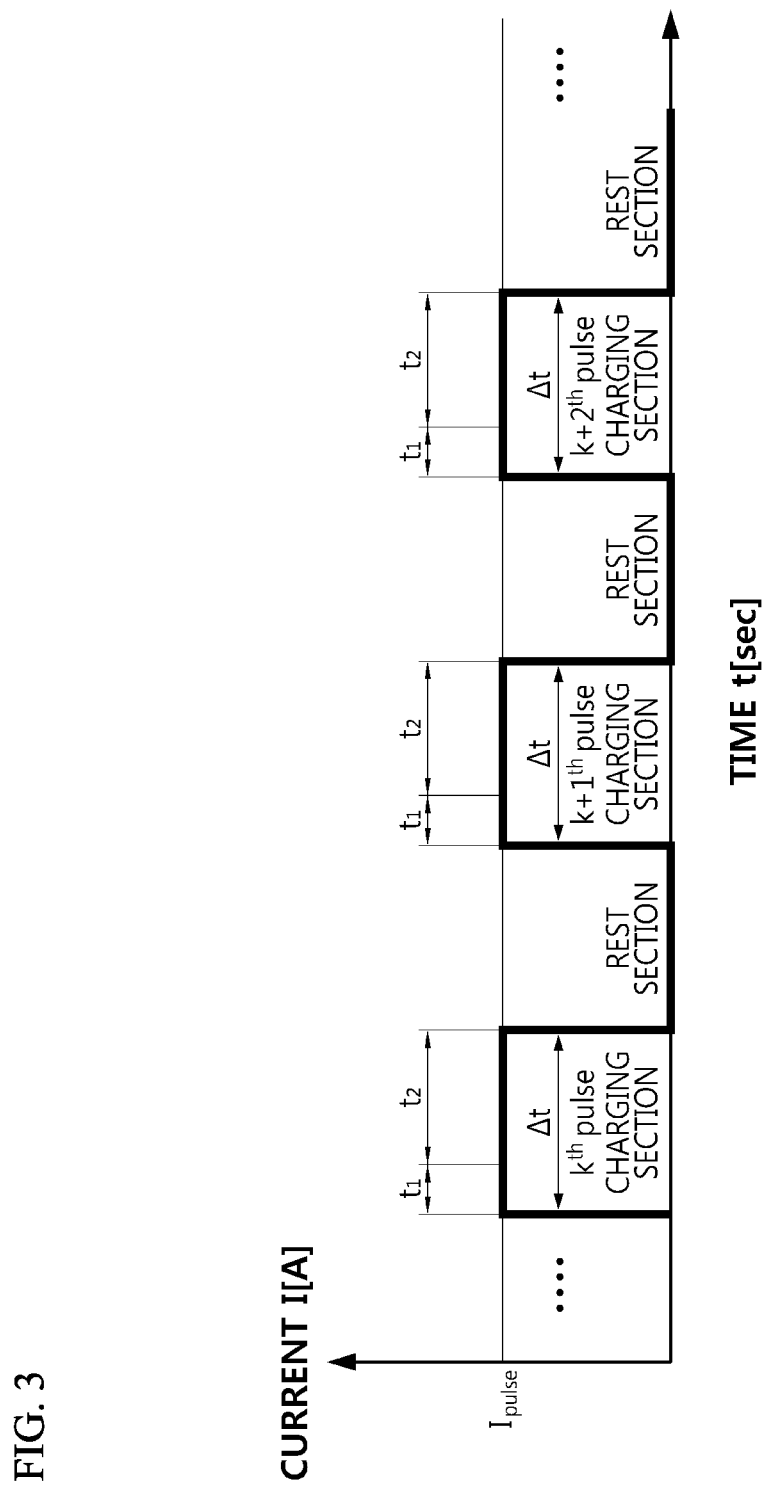
FIG. 3 is a graph showing an example of a pulse current flowing through the secondary battery while the secondary battery is being charged in a deterioration diagnosing SOC section according to an embodiment of the present disclosure.

FIG. 3 is a graph showing an example of a pulse current applied to the secondary battery 20 while the secondary battery is being charged in a deterioration diagnosing SOC section according to an embodiment of the present disclosure.

Referring to FIG. 3, if a charging pulse current with a duration of $\Delta t$ is applied to the secondary battery 20, an electrochemical reaction of lithium ions occurs on the surface of the negative electrode active material during an initial short time $t_1$, and then lithium ions are diffused inside the negative electrode active material during a remaining time $t_2$.

Hereinafter, a time section in which the electrochemical reaction occurs among the sections of the charging pulse current is defined as an electrochemical reaction section $t_1$, and a time section in which the diffusion of lithium ions occurs is defined as an ion diffusion section $t_2$.

Preferably, the duration of the ion diffusion section $t_2$ is longer than the duration of the electrochemical reaction section $t_1$.

In an example, when the positive electrode active material and the negative electrode active material included in the secondary battery 20 are $Li_aNi_xCo_yMn_zO_2$ and graphite, respectively, and the magnitude $I_{pulse}$ of the charging pulse is 0.5 C-rate, the electrochemical reaction section $t_1$ may be from 0 second to 0.1 second, and the ion diffusion section $t_2$ may be from 0.1 second to 10 seconds. That is, the duration of the electrochemical reaction section $t_1$ may be 0.1 second, and the duration of the ion diffusion section $t_2$ may be 9.9 seconds.

Meanwhile, it is obvious that the duration of the electrochemical reaction section $t_1$ and the duration of the ion diffusion section $t_2$ may vary depending on the reaction mechanism of lithium ions and the type and diameter of active material particles.

Preferably, the duration of the electrochemical reaction section $t_1$ and the duration of the ion diffusion section $t_2$ may be set in advance through an experiment and may be stored in advance in the storage unit 60.

The control unit 40 may periodically apply a charging pulse current having a duration of $\Delta t$ and a DC current magnitude of $I_{pulse}$ to the secondary battery 20 by controlling the charging unit C while the SOC of the secondary battery 20 passes through the preset deterioration diagnosing SOC section in order to determine the type of the deterioration-biased electrode when the secondary battery 20 is charged.

The charging pulse current may be applied to the secondary battery 20 together with a constant current while the secondary battery 20 is being charged in a constant current mode, or may be applied to the secondary battery 20 in a state where the constant current charging is stopped.

The control unit 40 may also receive the operation characteristic value of the secondary battery 20 from the sensor unit 30 periodically while each charging pulse current is applied and record the same in the storage unit 60, and calculate a first voltage change amount $\Delta V_{1,k}$ generated in the electrochemical reaction section $t_1$ and a second voltage change amount $\Delta V_{2,k}$ generated in the ion diffusion section $t_2$ with reference to the operation characteristic value, and calculate an electrochemical reaction resistance $R_{t1,k}$ ($\Delta V_{1,k}/I_{pulse}$) and an ion diffusion resistance $R_{t2,k}$ ($\Delta V_{2,k}/I_{pulse}$) using Ohm's law, respectively.

Here, k is a sequence index of the charging pulse current. Therefore, when a $k+1^{th}$ charging pulse current is applied, the electrochemical reaction resistance $R_{t1,k+1}$ and the ion diffusion resistance $R_{t2,k+1}$ are $\Delta V_{1,k+1}/I_{pulse}$ and $\Delta V_{2,k+1}/I_{pulse}$, respectively. In addition, when a $k+2^{th}$ charging pulse current is applied, the electrochemical reaction resistance $R_{t1,k}+_2$ and the ion diffusion resistance $R_{t2,k+2}$ are $\Delta V_{1,k+2}/I_{pulse}$ and $\Delta V_{2,k+2}/I_{pulse}$, respectively. In addition, when an $n^{th}$ charging pulse current is applied, the electrochemical reaction resistance $R_{t1,n}$ and the ion diffusion resistance $R_{t2,n}$ are $\Delta V_{1,n}/I_{pulse}$ and $\Delta V_{2,n}/I_{pulse}$, respectively.

The control unit 40 may also receive the operation characteristic values from the sensor unit 30 and records the same in the storage unit 60 whenever each charging pulse current is applied to the secondary battery 20 while the secondary battery 20 is being charged in the deterioration diagnosing SOC section by the charging unit C, and determine the SOC ($SOC_k$) of the secondary battery 20 with reference to the operation characteristic value.

Here, k is a sequence index of the charging pulse current, and $SOC_k$ represents a SOC of the secondary battery 20 calculated after a $k^{th}$ charging pulse current is applied to the secondary battery 20.

As an example, the control unit 40 may calculate a SOC change amount ($I_{pulse}*\Delta t/Q$) by counting the measured current value $I_{pulse}$ of the secondary battery 20 over time whenever a charging pulse current is applied to the secondary battery 20, and determine a SOC ($SOC_k$) by adding the SOC change amount ($I_{pulse}*\Delta t/Q_{cell}$) to a previous SOC ($SOC_{k-1}$).

Here, $I_{pulse}$ is the magnitude of the charging pulse current, $\Delta t$ is a duration of the charging section in the charging pulse, and $Q_{cell}$ is a charging capacity of the secondary battery 20.

As another example, the control unit 40 may adaptively determine the SOC ($SOC_k$) of the secondary battery 20 whenever each charging pulse current is applied while the secondary battery 20 is being charged in the deterioration diagnosing SOC section using an extended Kalman filter.

The extended Kalman filter is widely known in the art to which the present disclosure belongs. As an example, the extended Kalman filter may be an adaptive algorithm based on an equivalent circuit model or an electrochemical ROM (Reduced Order Model).

The estimation of SOC using the extended Kalman filter is described, as an example, in the paper of Gregory L. Plett "Extended Kalman filtering for battery management systems of LiPB-based HEV battery packs, Parts 1, 2 and 3" (Journal of Power Source 134, 2004, 252-261), which may be incorporated as a part of this specification.

Of course, the SOC ($SOC_k$) of the secondary battery 20 may be determined by other known methods capable of determining SOC by selectively utilizing the operation characteristic value of the secondary battery 20, in addition to the above-described current counting method or the extended Kalman filter.

Preferably, the control unit 40 may record the SOC ($SOC_k$), the electrochemical reaction resistance $R_{t1,k}$ ($\Delta V_{1,k}/I_{pulse}$) and the ion diffusion resistance $R_{t2,k}$ ($\Delta V_{2,k}/I_{pulse}$) determined whenever each charging pulse current is applied to the secondary battery 20 in the storage unit 60. The number of data recorded in the storage unit 60 is identical to the number of charging pulse currents.

If the data on the electrochemical reaction resistance $R_{t1,k}$ and the ion diffusion resistance $R_{t2,k}$ for each SOC are stored in the storage unit 60, the control unit 40 controls the charging unit C to switch to a normal charging mode to continuously charge the secondary battery 20 until the secondary battery 20 is charged to a full charging state.

In the normal charging mode, the control unit 40 may control the charging unit C to apply a charging pulse current or a constant current to the secondary battery 20.

After acquiring a plurality of data on the electrochemical reaction resistance $R_{t1,k}$ and the ion diffusion resistance $R_{t2,k}$ in the deterioration diagnosing SOC section, the control unit 40 calculates a relative ratio $R_{t2,k}/R_{t1,k}$ of the ion diffusion resistance $R_{t2,k}$ to the electrochemical reaction resistance $R_{t1,k}$ for each SOC ($SOC_k$) and record the same in the storage unit 60.

Here, $R_{t2,k}/R_{t1,k}$ is named as a deterioration diagnosing resistance ratio corresponding to SOC ($SOC_k$), and the number of deterioration diagnosing resistance ratios recorded in the storage unit 60 is identical to the number of charging pulse currents.

The control unit 40 also identifies a deterioration-biased electrode having a relatively large deterioration degree by comparing the deterioration diagnosing resistance ratio $R_{t2,k}/R_{t1,k}$ calculated for each SOC ($SOC_k$) with a reference deterioration diagnosing resistance ratio $R_{t2,k,refer}/R_{t1,k,refer}$ preset for each SOC ($SOC_k$).

The reference deterioration diagnosing resistance ratio $R_{t2,k,refer}/R_{t1,k,refer}$ may be determined according to the above-described method based on the secondary battery 20 in a BOL state and then recorded in the storage unit 60 in advance. The number of reference deterioration diagnosing resistance ratios $R_{t2,k,refer}/R_{t1,k,refer}$ recorded in the storage unit 60 is identical to the number of charging pulse currents.

According to an embodiment, if an average value of the deterioration diagnosing resistance ratio $R_{t2,k}/R_{t1,k}$ calculated for each SOC ($SOC_k$) is greater than an average value of the reference deterioration diagnosing resistance ratio $R_{t2,k,refer}/R_{t1,k,refer}$ preset for each SOC ($SOC_k$), the control unit 40 may determine the positive electrode as the deterioration-biased electrode. Alternatively, if a ratio of the SOC section where the deterioration diagnosing resistance ratio $R_{t2,k}/R_{t1,k}$ is greater than the reference deterioration diagnosing resistance ratio $R_{t2,k,refer}/R_{t1,k,refer}$ in the deterioration diagnosing SOC section is equal to or greater than a threshold value, the positive electrode may be determined as the deterioration-biased electrode.

Conversely, if the average value of the deterioration diagnosing resistance ratio $R_{t2,k}/R_{t1,k}$ calculated for each SOC ($SOC_k$) is smaller than the average value of the reference deterioration diagnosing resistance ratio $R_{t2,k,refer}/R_{t1,k,refer}$ preset for each SOC ($SOC_k$), the control unit 40 may determine the negative electrode as the deterioration-biased electrode. Alternatively, when the ratio of the SOC section where the deterioration diagnosing resistance ratio $R_{t2,k}/R_{t1,k}$ is smaller than the reference deterioration diagnosing resistance ratio $R_{t2,k,refer}/R_{t1,k,refer}$ in the deterioration diagnosing SOC section is equal to or greater than the threshold value, the negative electrode may be determined as the deterioration-biased electrode.

The above determination criterion is effective when the negative electrode of the secondary battery 20 has an OCV profile including a flat section, and the positive electrode of the secondary battery 20 has an OCV profile not including a flat section.

According to another embodiment, if the average value of the deterioration diagnosing resistance ratio $R_{t2,k}/R_{t1,k}$ calculated for each SOC ($SOC_k$) is greater than the average value of the reference deterioration diagnosing resistance ratio $R_{t2,k,refer}/R_{t1,k,refer}$ preset for each SOC ($SOC_k$), the control unit 40 may determine the negative electrode as the deterioration-biased electrode. Alternatively, when the ratio of the SOC section where the deterioration diagnosing resistance ratio $R_{t2,k}/R_{t1,k}$ is greater than the reference deterioration diagnosing resistance ratio $R_{t2,k,refer}/R_{t1,k,refer}$ in the deterioration diagnosing SOC section is equal to or greater than the threshold value, the negative electrode may be determined as the deterioration-biased electrode.

Conversely, if the average value of the deterioration diagnosing resistance ratio $R_{t2,k}/R_{t1,k}$ calculated for each SOC ($SOC_k$) is smaller than the average value of the reference deterioration diagnosing resistance ratio $R_{t2,k,refer}/R_{t1,k,refer}$ preset for each SOC ($SOC_k$), the control unit 40 may determine the positive electrode as the deterioration-biased electrode. Alternatively, when the ratio of the SOC section where the deterioration diagnosing resistance ratio $R_{t2,k}/R_{t1,k}$ is smaller than the reference deterioration diagnosing resistance ratio $R_{t2,k,refer}/R_{t1,k,refer}$ in the deterioration diagnosing SOC section is equal to or greater than the threshold value, the positive electrode may be determined as the deterioration-biased electrode.

The above determination criterion is effective when the positive electrode of the secondary battery 20 has an OCV profile including a flat section, and the negative electrode of the secondary battery 20 has an OCV profile not including a flat section.

After determining the deterioration-biased electrode, the control unit 40 may adaptively adjust the charging/discharging operation condition of the secondary battery 20 by controlling the charging unit C or the load management system according to the type of the deterioration-biased electrode and the deviation of the deterioration diagnosing resistance ratio $R_{t2,k}/R_{t1,k}$ calculated for each SOC ($SOC_k$) and the reference deterioration diagnosing resistance ratio $R_{t2,k,refer}/R_{t1,k,refer}$ calculated for each SOC ($SOC_k$).

Preferably, the charging/discharging operation condition may be at least one selected from a charging cutoff voltage, a discharging cutoff voltage, a rest section of the charging pulse current, a rest section of the discharging pulse current, a C-rate of the charging current, and a C-rate of the discharging current.

In an example, if the deterioration-biased electrode is the positive electrode, when performing a next charging/discharging cycle, the control unit 40 may decrease the charging cutoff voltage, increase the discharging cutoff voltage, decrease the C-rate of the charging current or the discharging current, or increase the rest section of the charging pulse current or the discharging pulse current according to the deviation between the average value of the deterioration diagnosing resistance ratio $R_{t2,k}/R_{t1,k}$ and the average value of the reference deterioration diagnosing resistance ratio $R_{t2,k,refer}/R_{t1,k,refer}$. Here, the increase of the rest section refers to an increase of rest time.

If the charging/discharging operation condition of the secondary battery 20 is changed as above, it is possible to mitigate the collapse of the structure of the active material particles included in the positive electrode at the end of charging or discharging.

Preferably, the variation amount for each charging/discharging operation condition may be defined in the form of a look-up table according to the deviation between the average value of the deterioration diagnosing resistance ratio $R_{t2,k}/R_{t1,k}$ and the average value of the reference deterioration diagnosing resistance ratio $R_{t2,k,refer}/R_{t1,k,refer}$ and recorded in the storage unit 60 in advance.

In this case, the control unit 40 may adaptively adjust the charging and discharging operation condition of the secondary battery 20 in the next charging/discharging cycle by controlling the charging unit C/the load management system with reference to the look-up table.

In another example, if the deterioration-biased electrode is the negative electrode, the control unit 40 may decrease the charging cutoff voltage, increase the discharging cutoff voltage, decrease the C-rate of the charging current or the discharging current, or increase the rest section of the charging pulse current or the discharging pulse current according to the deviation between the average value of the deterioration diagnosing resistance ratio $R_{t2,k}/R_{t1,k}$ and the average value of the reference deterioration diagnosing resistance ratio $R_{t2,k,refer}/R_{t1,k,refer}$.

If the charging/discharging operation condition of the secondary battery 20 is changed as above, lithium ions may be sufficiently diffused into the active material particles to prevent lithium from being precipitated in the negative electrode.

Preferably, the variation amount for each charging/discharging operation condition may be defined in the form of a look-up table according to the deviation between the average value of the deterioration diagnosing resistance ratio $R_{t2,k}/R_{t1,k}$ and the average value of the reference deterioration diagnosing resistance ratio $R_{t2,k,refer}/R_{t1,k,refer}$ and recorded in the storage unit 60 in advance.

In this case, the control unit 40 may adaptively adjust the charging/discharging operation condition of the secondary battery 20 in the next charging/discharging cycle by controlling the charging unit C/the load management system with reference to the look-up table.

Meanwhile, the present disclosure may be applied even when the secondary battery 20 operates in a discharging mode, unlike the former embodiment. In this case, the control unit 40 may control the load management system while the SOC of the secondary battery 20 passes through the deterioration diagnosing SOC section in a discharging mode so that the discharging pulse current flows through the secondary battery 20.

The discharging pulse current is identical to the charging pulse current, except that the direction of the discharging pulse current is opposite to that of the charging pulse current. The discharging pulse current may flow through the secondary battery 20 while maintaining a constant current discharge of the secondary battery 20, or may flow through the secondary battery 20 in a state where the constant current discharging of the secondary battery 20 is stopped.

The control unit 40 may determine a SOC of the secondary battery by using the operation characteristic value of the secondary battery 20 measured through the sensor unit 30 whenever the discharging pulse current flows through the secondary battery 20 in the preset deterioration diagnosing SOC section. In addition, the control unit 40 may determine an electrochemical reaction resistance from the voltage change amount measured during the preset initial time in each discharging pulse current section, and determine the ion diffusion resistance from the voltage change amount measured during the remaining time except for the initial time.

In addition, the control unit 40 may determine a deterioration-biased electrode having a relatively large deterioration degree by comparing the deterioration diagnosing resistance ratio, which is a relative ratio of the ion diffusion resistance to the electrochemical reaction resistance, with the preset reference deterioration diagnosing resistance ratio. In addition, the control unit 40 may adaptively adjust the operation condition of the next charging/discharging cycle according to the type of the deterioration-biased electrode as in the above-descried embodiment.

In the present disclosure, the storage unit 60 is a storage medium capable of recording and erasing data electrically, magnetically, optically or quantum mechanically. Non-limiting examples of the storage unit 60 may include a RAM, a ROM, a register, a hard disk, an optical recording medium, and a magnetic recording medium. The storage unit 60 may be electrically coupled to the control unit 40, for example via a data bus, to be accessible by the control unit 40.

The storage unit 60 may store and/or update and/or delete a program including various control logics executed by the control unit 40, and/or data generated when the control logics are executed, and/or predefined data, parameters and look-up tables required for execution of various control logics. The storage unit 60 may be logically divided into two or more parts. In the present disclosure, the control unit 40 may optionally include a processor, an application-specific integrated circuit (ASIC), another chipset, a logic circuit, a register, a communication modem, a data processing device, or the like, known in the art to execute the various control logics described above.

In addition, when the control logic is implemented in software, the control unit 40 may be implemented as a set of program modules. At this time, the program module may be stored in a memory and executed by a processor. The memory may be provided inside or outside the processor and be connected to the processor through various well-known computer components. Also, the memory may be included in the storage unit 60 of the present disclosure. In addition, the memory refers to a device in which information is stored, regardless of the type of device, and does not refer to a specific memory device.

In addition, one or more of the various control logics of the control unit 40 may be combined, and the combined control logics may be written in a computer-readable code system and recorded in a computer-readable recording medium. The recording medium is not particularly limited as long as it is accessible by a processor included in a computer. As an example, the storage medium includes at least one selected from the group consisting of a ROM, a RAM, a register, a CD-ROM, a magnetic tape, a hard disk, a floppy disk and an optical data recording device. The code scheme may be distributed to a networked computer to be stored and executed therein. In addition, functional programs, codes and code segments for implementing the combined control logics may be easily inferred by programmers in the art to which the present disclosure belongs.

Figure 9:
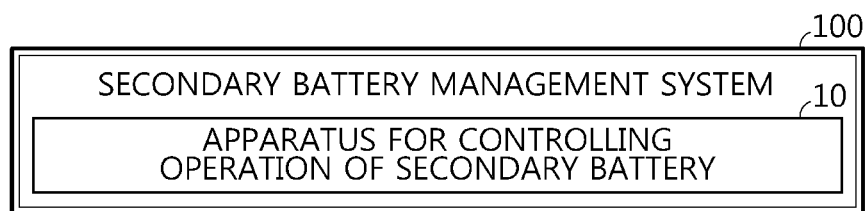
FIG. 9 is a block diagram showing a battery management system including the apparatus for controlling an operation of a secondary battery according to an embodiment of the present disclosure.

The apparatus 10 for controlling an operation of a secondary battery according to the present disclosure may be included in a battery management system 100 as shown in FIG. 9.

The battery management system 100 controls the overall operation related to charging and discharging of a battery, and is a computing system called a battery management system (BMS) in the art.

Figure 10:
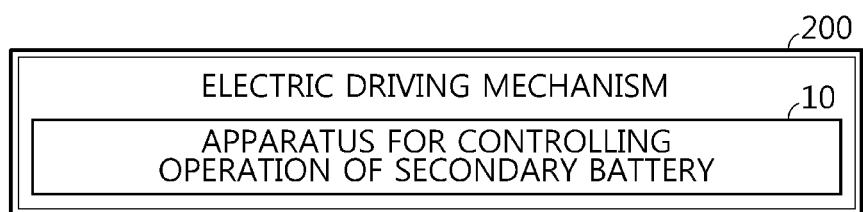
FIG. 10 is a block diagram showing an electric driving mechanism including the apparatus for controlling an operation of a secondary battery according to an embodiment of the present disclosure.

In addition, the apparatus 10 for controlling an operation of a secondary battery according to the present disclosure may be mounted to various types of electric driving mechanism 200 as shown in FIG. 10.

According to an embodiment, the electric driving mechanism 200 may be a mobile computer device such as a mobile phone, a laptop computer and a tablet computer, or a handheld multimedia device such as a digital camera, a video camera and an audio/video reproduction device.

According to another embodiment, the electric driving mechanism 200 may be an electric power device movable by electricity, such as an electric vehicle, a hybrid electric vehicle, an electric bicycle, an electric motorcycle, an electric train, an electric ship and an electric plane, or a power tool having a motor, such as an electric drill and an electric grinder.

Figure 4:
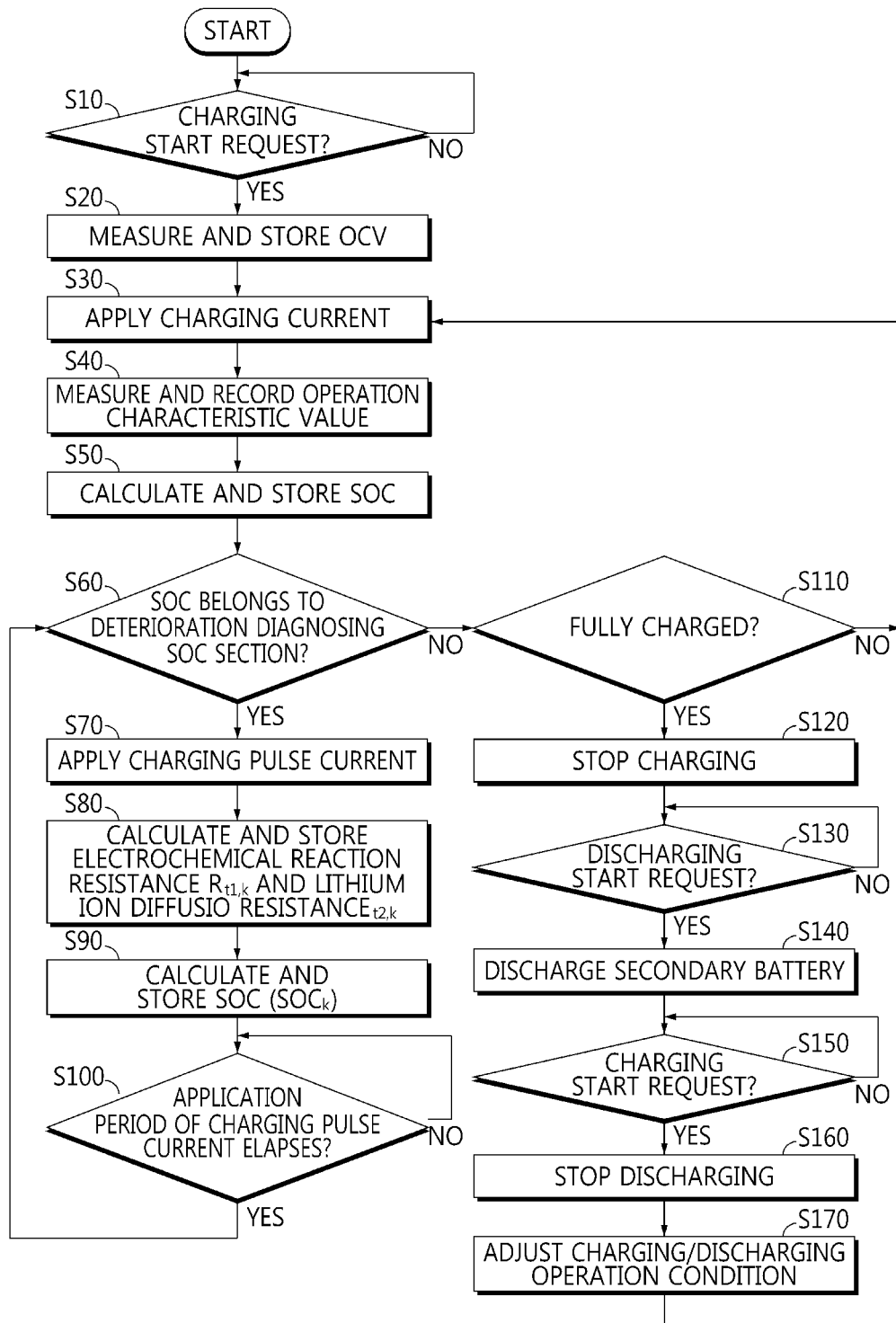
FIG. 4 is a flowchart for specifically illustrating a method for controlling an operation of a secondary battery using a relative deterioration degree of an electrode according to an embodiment of the present disclosure.

FIG. 4 is a flowchart for specifically illustrating a method for controlling an operation of a secondary battery using a relative deterioration degree of an electrode according to an embodiment of the present disclosure.

As shown in FIG. 4, first, if the process starts, in Step S10, the control unit 40 determines whether there is a charging start request.

In an example, if the secondary battery 20 is connected to the charging unit C, the control system of the charging unit C may transmit a charging start request to the control unit 40.

If the determination of Step S10 is YES, Step S20 proceeds, and if the determination of Step S10 is NO, the progress of the process is deferred.

In Step S20, the control unit 40 measures an OCV value of the secondary battery 20 using the sensor unit 30 and records the same in the storage unit 60. Here, the OCV value corresponds to a measured voltage value of the secondary battery 20 measured before charging starts. Step S30 proceeds after Step S20.

In Step S30, the control unit 40 turns on a switch installed on a line that connects the secondary battery 20 and the charging unit C, and controls the charging unit C to apply a charging current to the secondary battery 20 according to a preset charging protocol.

Preferably, the charging protocol may be a CC-CV charging protocol, a pulse charging protocol, a constant current-constant power charging protocol, or the like, but the present disclosure is not limited thereto. Step S40 proceeds after Step S30.

In Step S40, the control unit 40 measures an operation characteristic value of the secondary battery 20 using the sensor unit 30 and records the same in the storage unit 60. Here, the operation characteristic value includes a measured voltage value, a measured current value and a temperature measurement value of the secondary battery. Step S50 proceeds after Step S40.

In Step S50, the control unit 40 calculates a SOC by using the operation characteristic value of the secondary battery 20 recorded in the storage unit 60 and stores the same in the storage unit 60.

Here, SOC may be calculated using a current counting method or an extended Kalman filter. Step S60 proceeds after Step S50.

In Step S60, the control unit 40 determines whether the SOC of secondary battery 20 belongs to a deterioration diagnosing SOC section. Preferably, the deterioration diagnosing SOC section refers to an SOC section corresponding to the flat section included in the OCV profile of the positive electrode or the OCV profile of the negative electrode.

If the determination of Step S60 is YES, Step S70 proceeds.

In Step S70, the control unit 40 controls the charging unit C to apply a charging pulse current to the secondary battery 20. The charging pulse current includes a charging section in which a DC current is applied and a rest section in which a DC current is not applied, as shown in FIG. 3. The charging section includes a preset electrochemical reaction section $t_1$ and an ion diffusion section $t_2$. The magnitude of the DC current applied to the secondary battery 20 in the charging section is $I_{pulse}$. Step S80 proceeds after Step S70.

In Step S80, the control unit 40 periodically measures the operation characteristic value of the secondary battery 20 using the sensor unit 30 while the charging pulse current is applied and records the same in the storage unit 60. In addition, the control unit 40 calculates a first voltage change amount ($\Delta V_{1,k}$) generated in the electrochemical reaction section $t_1$ and a second voltage change amount ($\Delta V_{2,k}$) generated in the ion diffusion section $t_2$ with reference to the operation characteristic value recorded in the storage unit 60, calculate the electrochemical reaction resistance $R_{t1,k}$ and ion diffusion resistance $R_{t2,k}$, respectively, using Ohm's law, and records the same in the storage unit 60. Here, k is a sequence index of the charging pulse current. Step S90 proceeds after Step S80.

In Step S90, the control unit 40 calculates a SOC change amount ($I_{pulse}*\Delta t/Q_{cell}$) according to the application of the charging pulse current by referring to the operation characteristic value of the secondary battery 20 recorded in the storage unit 60. In addition, the control unit 40 determines a SOC ($SOC_k$) after the charging pulse current is applied by counting the SOC change amount ($I_{pulse}*\Delta t/Q_{cell}$) to the previous SOC ($SOC_{k-1}$), and records the same in the storage unit 60. Here, $I_{pulse}$ is the magnitude of the charging pulse current, $\Delta t$ is the duration of the charging section, and $Q_{cell}$ is the charging capacity of the secondary battery 20. Step S100 proceeds after Step S90.

In Step S100, the control unit 40 determines whether the application period of the charging pulse current has elapsed. If the determination in Step S100 is NO, the process is deferred, and if the determination in Step S100 is YES, the process returns to S60.

When the process returns to Step S60, if the SOC ($SOC_k$) of the secondary battery 20 belongs to the deterioration diagnosing SOC section, the control unit 40 repeats the process of applying a charging pulse current again (S70), calculating the electrochemical reaction resistance $R_{t1,k}$ and the ion diffusion resistance $R_{t2,k}$ and records the same in the storage unit 60 (S80), and calculating a SOC change amount ($I_{pulse}*Mt/Q_{cell}$) according to the application of the charging pulse current to calculate the SOC ($SOC_k$) after the charging pulse current is applied and records the same in the storage unit 60 (S90). Therefore, Steps S70 to S90 are continuously repeated whenever a charging pulse current is applied to the secondary battery 20 while the SOC ($SOC_k$) of the secondary battery 20 belongs to the deterioration diagnosing SOC section.

By dong so, the control unit 40 may acquire a plurality of data about the electrochemical reaction resistance $R_{t1,k}$ and the ion diffusion resistance $R_{t2,k}$ for each SOC ($SOC_k$) while the SOC ($SOC_k$) of the secondary battery 20 passes through the deterioration diagnosing SOC section.

Meanwhile, if the determination of Step S60 is NO, namely if the SOC ($SOC_k$) of the secondary battery 20 does not belong to the deterioration diagnosing SOC section, the process proceeds to Step S110.

In Step S110, the control unit 40 determines whether the secondary battery 20 is fully charged. In an example, if the SOC ($SOC_k$) of the secondary battery 20 becomes 100%, the control unit 40 may determine that the secondary battery 20 is fully charged.

If the determination result of Step S110 is YES, the control unit 40 stops the charging of the secondary battery in Step S120, and if the determination result of Step S110 is NO, the process proceeds to Step S30 to continuously apply the charging current to the secondary battery 20 by controlling the charging unit C according to the preset charging protocol. The applied charging current may be a constant current or a pulse current. Step S130 proceeds after Step S120.

In Step S130, the control unit 40 determines whether there is a discharging start request for the secondary battery 20. In an example, the control unit 40 may receive a discharging start request from the load control system.

If the determination in Step S130 is YES, the control unit 40 turns on a switch installed on a line that connects the secondary battery 20 and the load L in Step S140 to discharge the secondary battery 20, and if the determination in Step S130 is NO, the process is deferred. Step S150 proceeds after Step S140.

In Step S150, the control unit 40 determines whether there is a charging start request. The charging start request may be provided from the control system of the charging unit C.

If the determination of Step S150 is NO, the control unit 40 maintains the discharging of the secondary battery 20, and if the determination of Step S150 is YES, the control unit 40 stops the discharging of the secondary battery 20 in Step S160. Step S170 proceeds after Step S160.

In Step S170, the control unit 40 adjusts the charging/discharging operation condition of the secondary battery 20.

Figure 5:
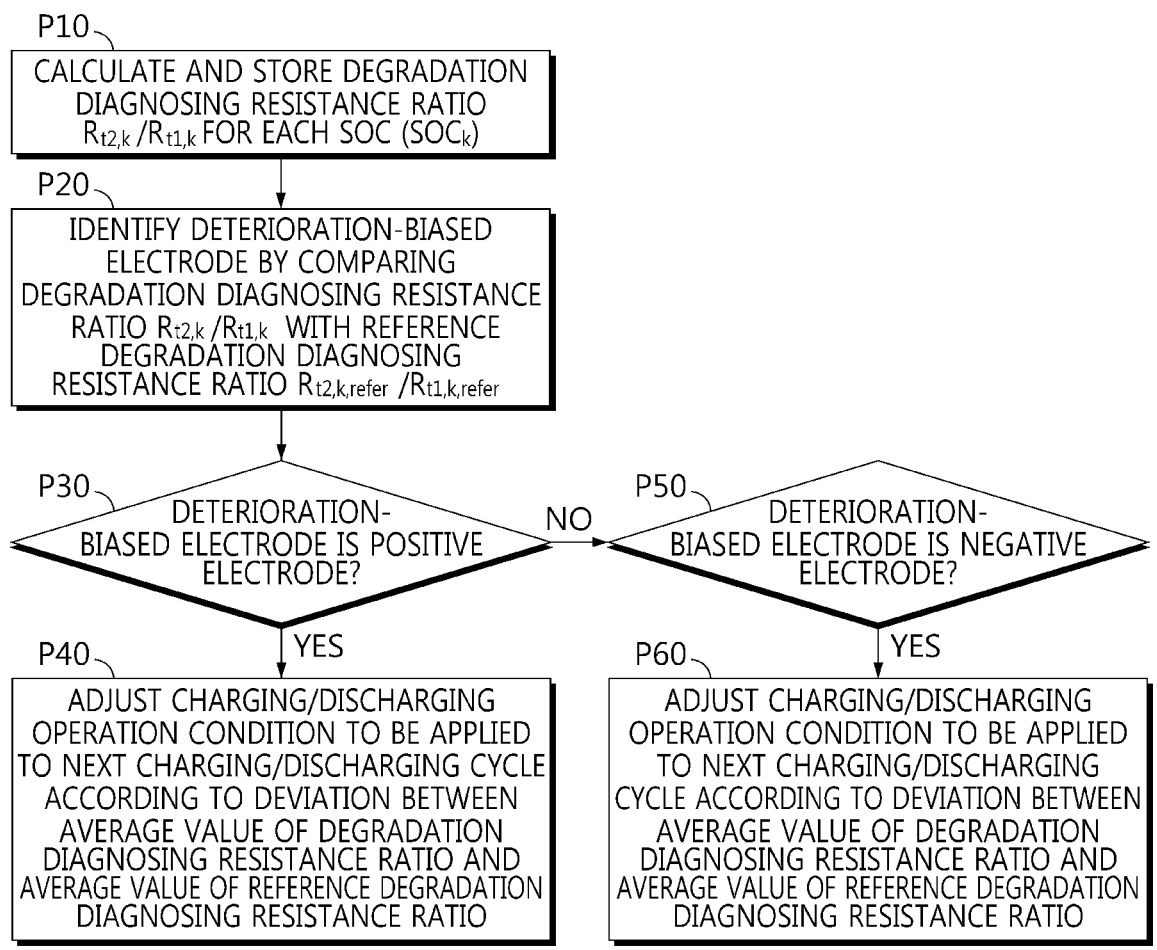
FIG. 5 is a flowchart for specifically illustrating a process of adjusting a charging operation condition of the secondary battery according to an embodiment of the present disclosure.

FIG. 5 is a flowchart for specifically illustrating a process of adjusting a charging operation condition of the secondary battery 20 by the control unit 40 according to an embodiment of the present disclosure.

Referring to FIG. 5, in Step P10, the control unit 40 calculates a deterioration diagnosing resistance ratio $R_{t2,k}/R_{t1,k}$ for each SOC ($SOC_k$) using the electrochemical reaction resistance $R_{t1,k}$ and the ion diffusion resistance $R_{t2,k}$ stored for each SOC ($SOC_k$) in the storage unit 60.

Here, k is a natural number of 1 to n, and n is the number of all charging pulse currents applied to the secondary battery 20 while the SOC ($SOC_k$) of the secondary battery 20 belongs to the deterioration diagnosing SOC section. Step P20 proceeds after Step P10.

In Step P20, the control unit 40 identifies a deterioration-biased electrode having a relatively large deterioration degree by comparing the deterioration diagnosing resistance ratio $R_{t2,k}/R_{t1,k}$ calculated for each SOC ($SOC_k$) with the reference deterioration diagnosing resistance ratio $R_{t2,k,refer}/R_{t1,k,refer}$ preset for each SOC ($SOC_k$).

According to an embodiment, in Step P20, if the average value of the deterioration diagnosing resistance ratio $R_{t2,k}/R_{t1,k}$ calculated for each SOC ($SOC_k$) is greater than the average value of the reference deterioration diagnosing resistance ratio $R_{t2,k,refer}/R_{t1,k,refer}$ preset for each SOC ($SOC_k$), the control unit 40 may determine the positive electrode as the deterioration-biased electrode.

Alternatively, in Step P20, if the ratio of the SOC section where the deterioration diagnosing resistance ratio $R_{t2,k}/R_{t1,k}$ is greater than the reference deterioration diagnosing resistance ratio $R_{t2,k,refer}/R_{t1,k,refer}$ is equal to or greater than a threshold value in the deterioration diagnosing SOC section, the control unit 40 may determine the positive electrode as the deterioration-biased electrode.

Conversely, in Step P20, if the average value of the deterioration diagnosing resistance ratio $R_{t2,k}/R_{t1,k}$ calculated for each SOC ($SOC_k$) is smaller than the average value of the reference deterioration diagnosing resistance ratio $R_{t2,k,refer}/R_{t1,k,refer}$ preset for each SOC ($SOC_k$), the control unit 40 may determine the negative electrode as the deterioration-biased electrode.

Alternatively, in Step P20, if the ratio of the SOC section where the deterioration diagnosing resistance ratio $R_{t2,k}/R_{t1,k}$ is smaller than the reference deterioration diagnosing resistance ratio $R_{t2,k,refer}/R_{t1,k,refer}$ is equal to or greater than the threshold value in the deterioration diagnosing SOC section, the control unit 40 may determine the negative electrode as the deterioration-biased electrode.

The above determination criterion is effective when the negative electrode of the secondary battery 20 has an OCV profile including a flat section, and the positive electrode of the secondary battery 20 has an OCV profile not including a flat section.

In another embodiment, in Step P20, if the average value of the deterioration diagnosing resistance ratio $R_{t2,k}/R_{t1,k}$ calculated for each SOC ($SOC_k$) is greater than the average value of the reference deterioration diagnosing resistance ratio $R_{t2,k,refer}/R_{t1,k,refer}$ preset for each SOC ($SOC_k$), the control unit 40 may determine the negative electrode as the deterioration-biased electrode.

Alternatively, in Step P20, if the ratio of the SOC section where the deterioration diagnosing resistance ratio $R_{t2,k}/R_{t1,k}$ is greater than the reference deterioration diagnosing resistance ratio $R_{t2,k,refer}/R_{t1,k,refer}$ is equal to or greater than the threshold value in the deterioration diagnosing SOC section, the control unit 40 may determine the negative electrode as the deterioration-biased electrode.

Conversely, in Step P20, if the average value of the deterioration diagnosing resistance ratio $R_{t2,k}/R_{t1,k}$ calculated for each SOC ($SOC_k$) is smaller than the average value of the reference deterioration diagnosing resistance ratio $R_{t2,k,refer}/R_{t1,k,refer}$ preset for each SOC ($SOC_k$), the control unit 40 may determine the positive electrode as the deterioration-biased electrode.

Alternatively, in Step P20, if the ratio of the SOC section where the deterioration diagnosing resistance ratio $R_{t2,k}/R_{t1,k}$ is smaller than the reference deterioration diagnosing resistance ratio $R_{t2,k,refer}/R_{t1,k,refer}$ is equal to or greater than the threshold value in the deterioration diagnosing SOC section, the control unit 40 may determine the positive electrode as the deterioration-biased electrode.

The above determination criterion is effective when the positive electrode of the secondary battery 20 has an OCV profile including a flat section, and the negative electrode of the secondary battery 20 has an OCV profile not including a flat section.

Step P30 proceeds after Step P20.

In Step P30, the control unit 40 determines whether the deterioration-biased electrode is a positive electrode.

If the determination of Step P30 is YES, namely if the deterioration-biased electrode is the positive electrode, in Step P40, the control unit 40 may adaptively adjust the charging/discharging operation condition to be applied to the next charging/discharging cycle according to the deviation between the average value of the deterioration diagnosing resistance ratio $R_{t2,k}/R_{t1,k}$ and the average value of the reference deterioration diagnosing resistance ratio $R_{t2,k,refer}/R_{t1,k,refer}$.

Preferably, the charging/discharging operation condition may be at least one selected from a charging cutoff voltage, a discharging cutoff voltage, a rest section of the charging pulse current, a rest section of the discharging pulse current, a C-rate of the charging current, and a C-rate of the discharging current.

In an example, if the deterioration-biased electrode is the positive electrode, when performing the next charging/discharging cycle, the control unit 40 may decrease the charging cutoff voltage, increase the discharging cutoff voltage, decrease the C-rate of the charging current or the discharging current, or increase the rest section of the charging pulse current or the discharging pulse current according to the deviation between the average value of the deterioration diagnosing resistance ratio $R_{t2,k}/R_{t1,k}$ and the average value of the reference deterioration diagnosing resistance ratio $R_{t2,k,refer}/R_{t1,k,refer}$. Here, the rest section refers to a rest time.

When the deterioration-biased electrode is the positive electrode, the variation amount for each charging/discharging operation condition may be set in advance as a look-up table according to the deviation between the average value of the deterioration diagnosing resistance ratio $R_{r2,k}/R_{r1,k}$ and the average value of the reference deterioration diagnosing resistance ratio $R_{r2,k,refer}/R_{r1,k,refer}$.

If the charging/discharging operation condition of the secondary battery 20 is changed as above, it is possible to mitigate the collapse of the structure of the active material particles included in the positive electrode at the end of charging or discharging.

If the determination of Step P30 is NO, in Step P50, the control unit 40 determines whether the deterioration-biased electrode is the negative electrode.

If the determination of Step P50 is YES, namely if the deterioration-biased electrode is the negative electrode, in Step P60, the control unit 40 may adaptively adjust the charging/discharging operation condition to be applied to the next charging/discharging cycle according to the deviation between is the average value of the deterioration diagnosing resistance ratio $R_{r2,k}/R_{r1,k}$ and the average value of the reference deterioration diagnosing resistance ratio $R_{r2,k,refer}/R_{r1,k,refer}$.

Specifically, in Step P60, if the deterioration-biased electrode is the negative electrode, the control unit 40 may decrease the charging cutoff voltage, increase the discharging cutoff voltage, decrease the C-rate of the charging current or the discharging current, or increase the rest section of the charging pulse current or the discharging pulse current according to the deviation between the average value of the deterioration diagnosing resistance ratio $R_{r2,k}/R_{r1,k}$ and the average value of the reference deterioration diagnosing resistance ratio $R_{r2,k,refer}/R_{r1,k,refer}$.

When the deterioration-biased electrode is the negative electrode, the variation amount for each charging/discharging operation condition may be set in advance as a look-up table according to the deviation between the average value of the deterioration diagnosing resistance ratio $R_{r2,k}/R_{r1,k}$ and the average value of the reference deterioration diagnosing resistance ratio $R_{r2,k,refer}/R_{r1,k,refer}$.

If the charging/discharging operation condition of the secondary battery 20 is changed as above, lithium ions may be sufficiently diffused into the active material particles to prevent lithium from being precipitated in the negative electrode.

The control unit 40 may adjust the charging/discharging operation condition to be applied in the next charging/discharging cycle in Step P40 or Step P60, and then proceed to Step S30 to apply a charging current to the secondary battery 20 according to the changed condition.

Meanwhile, the present disclosure may be applied even when the secondary battery 20 operates in a discharging mode, unlike the above-described embodiment.

In this case, the control logic shown in FIG. 4 may be easily changed to be suitable for the discharging mode of the secondary battery 20, as being obvious to those skilled in the art.

That is, when the secondary battery 20 is discharged in the deterioration diagnosing SOC section, the control unit 40 may control the load management system so that a discharging pulse current flows through the secondary battery 20, determine a deterioration diagnosing resistance ratio by calculating the ratio of the electrochemical reaction resistance and the ion diffusion resistance for each SOC whenever each discharging pulse current flows, determine a deterioration-biased electrode by comparing the deterioration diagnosing resistance ratio calculated for each SOC with the preset reference deterioration diagnosing resistance ratio, and adjust the charging/discharging operation condition to be applied to the next charging/discharging cycle according to the type of the deterioration-biased electrode.

According to the present disclosure, for the secondary battery in a MOL state, the type of electrode having a relatively large deterioration degree may be identified out of the positive electrode and the negative electrode, and the charging/discharging operation condition may be adaptively controlled in consideration of the electrochemical characteristics of the corresponding electrode.

Therefore, it is possible to safely control the charging/discharging operation of the secondary battery in a MOL state, compared to the prior art in which the charging/discharging operation condition is adjusted in consideration of the deterioration degree of the entire secondary battery.

In addition, since the charging/discharging operation condition is adaptively controlled by focusing on the electrode having a relatively large deterioration degree, the life of the secondary battery may be increased by balancing the positive electrode deterioration degree and the negative electrode deterioration degree.

Experimental Example

Hereinafter, an experimental example of the present disclosure will be described. This experimental example is provided to explain the effect of the present disclosure, and it is obvious that the scope of the present disclosure is not limited by the experimental example described below.

Figure 6:
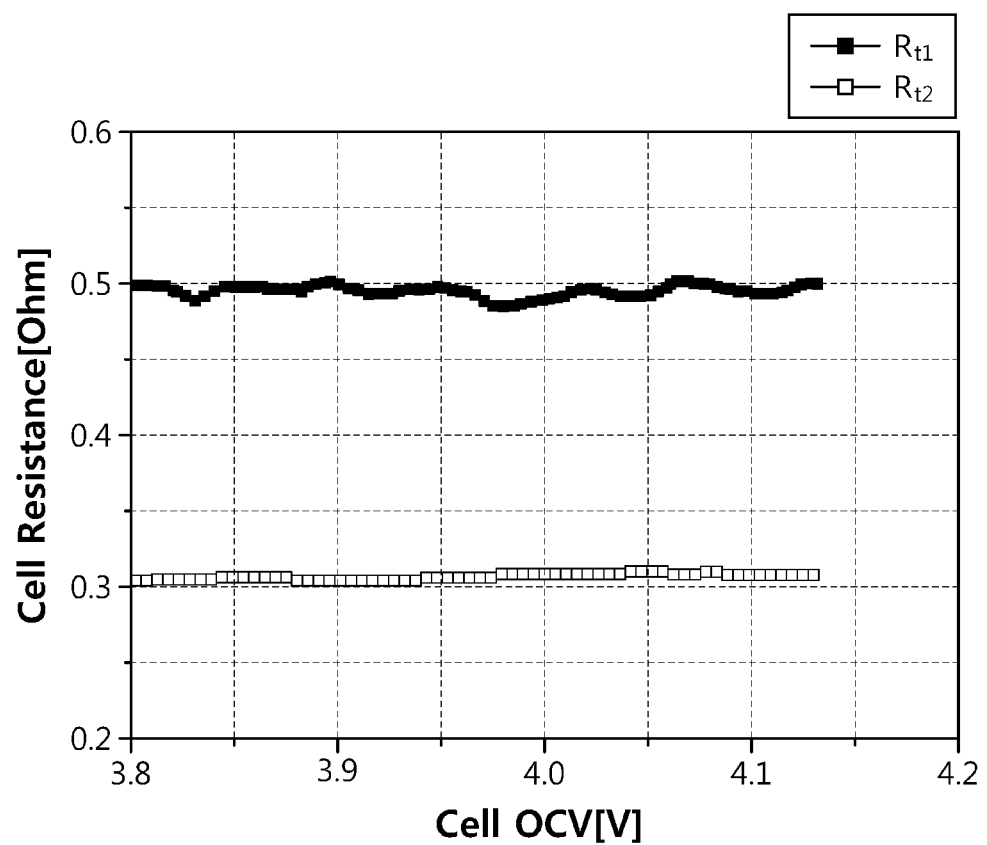
FIG. 6 is a graph in which an electrochemical reaction resistance $R_{t1,k}$ and an ion diffusion resistance $R_{t2,k}$ calculated while a lithium secondary battery in a BOL state is being charged in a deterioration diagnosing SOC section are plotted according to OCV.

FIG. 6 is a graph in which an electrochemical reaction resistance $R_{r1,k}$ and an ion diffusion resistance $R_{r2,k}$ calculated whenever a charging pulse current is applied to a lithium secondary battery while the lithium secondary battery in a BOL state is being charged in a deterioration diagnosing SOC section where SOC is 67% to 97% are plotted according to OCV.

Since OCV is in a 1:1 relationship with SOC, each graph is substantially identical to the profile of the electrochemical reaction resistance $R_{r1,k}$ and the ion diffusion resistance $R_{r2,k}$ according to SOC.

The lengths of the charging section and the rest section of the charging pulse current applied to the lithium secondary battery are 10 seconds, respectively. Also, in the charging section, the section during which the electrochemical reaction resistance is determined is 0.1 seconds, and the section during which the ion diffusion resistance is determined is 9.9 seconds.

The magnitude $I_{pulse}$ of the charging pulse current is 0.5 C-rate.

The lithium secondary battery is a lithium polymer cell, which includes $Li_aNi_xCo_yMn_zO_2$, which is a lithium transition metal oxide, as a positive electrode active material and includes graphite as a negative electrode active material. The electrolyte of the lithium secondary battery includes a solvent and a lithium salt. The solvent includes EC (Ethylene Carbonate) and EMC (Ethyl Methyl Carbonate) in a weight ratio of 3:7. The lithium salt is $LiPF_6$ with a concentration of 1 mol.

In FIG. 6, a closed square represents the electrochemical reaction resistance $R_{r1,k}$, and an open square represents the ion diffusion resistance $R_{r2,k}$.

As shown in the drawing, the electrochemical reaction resistance $R_{r1,k}$ is relatively greater than the ion diffusion resistance $R_{r2,k}$.

Figure 7:
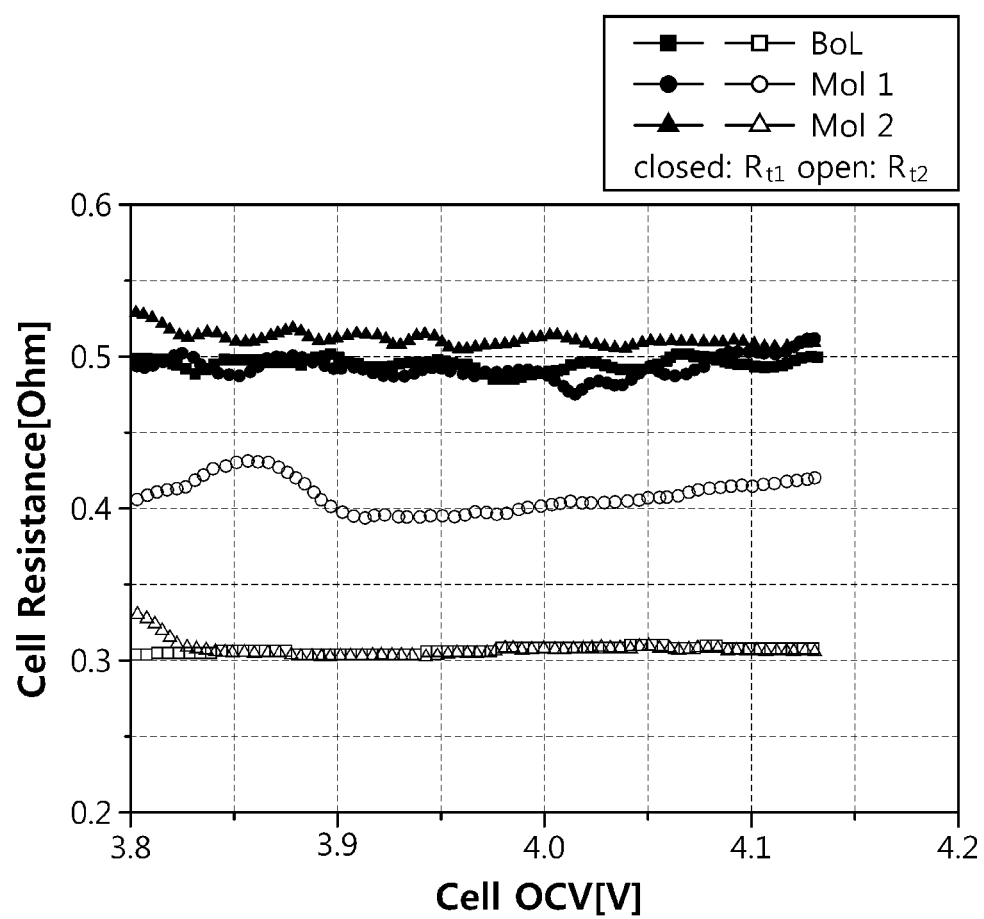
FIG. 7 is a graph in which a lithium secondary battery in a MOL1 state and a lithium secondary battery in a MOL2 state are prepared and then an electrochemical reaction resistance $R_{t1,k}$ and an ion diffusion resistance $R_{t2,k}$ calculated while a charging pulse current is flowing through each lithium secondary battery in a deterioration diagnosing SOC section where SOC is 67% to 97% are plotted according to OCV.

FIG. 7 is a graph in which a lithium secondary battery in a MOL1 state and a lithium secondary battery in a MOL2 state are prepared and then an electrochemical reaction resistance $R_{r1,k}$ and an ion diffusion resistance $R_{r2,k}$ calculated while through each lithium secondary battery is pulse-charged in a deterioration diagnosing SOC section where SOC is 67% to 97% are plotted according to OCV.

The lithium secondary battery in a MOL1 state is a secondary battery in which the deterioration degree of the positive electrode is relatively larger than the deterioration degree of the negative electrode. In the lithium secondary battery in a MOL1 state, the structure of the active material included in the positive electrode is deteriorated by intentionally causing overcharging of the secondary battery so that the deterioration degree of the positive electrode is increased relatively larger than the positive electrode of negative electrode.

The lithium secondary battery in a MOL2 state is a secondary battery in which the deterioration degree of the negative electrode is relatively larger than the deterioration degree of the positive electrode. In the lithium secondary battery in a MOL2 state, the deterioration degree of the negative electrode is increased relatively larger than the deterioration degree of the positive electrode by intentionally applying a charging condition in which lithium is precipitated on the surface of the active material particles contained in the negative electrode.

In FIG. 7, the profile plotted with closed squares represents the electrochemical reaction resistance $R_{r1,k}$ of the lithium secondary battery in a BOL state, and the profile plotted with open squares represents the ion diffusion resistance $R_{r2,k}$ of the lithium secondary battery in a BOL state.

In addition, the profile plotted with closed circles represents the electrochemical reaction resistance $R_{r1,k}$ of the lithium secondary battery in a MOL1 state, and the profile plotted with open circles represents the ion diffusion resistance $R_{r2,k}$ of the lithium secondary battery in a MOL1 state.

In addition, the profile plotted with closed triangles represents the electrochemical reaction resistance $R_{r1,k}$ of the lithium secondary battery in a MOL2 state, and the profile plotted with open triangles represents the ion diffusion resistance $R_{r2,k}$ of the lithium secondary battery in a MOL2 state.

Figure 8:
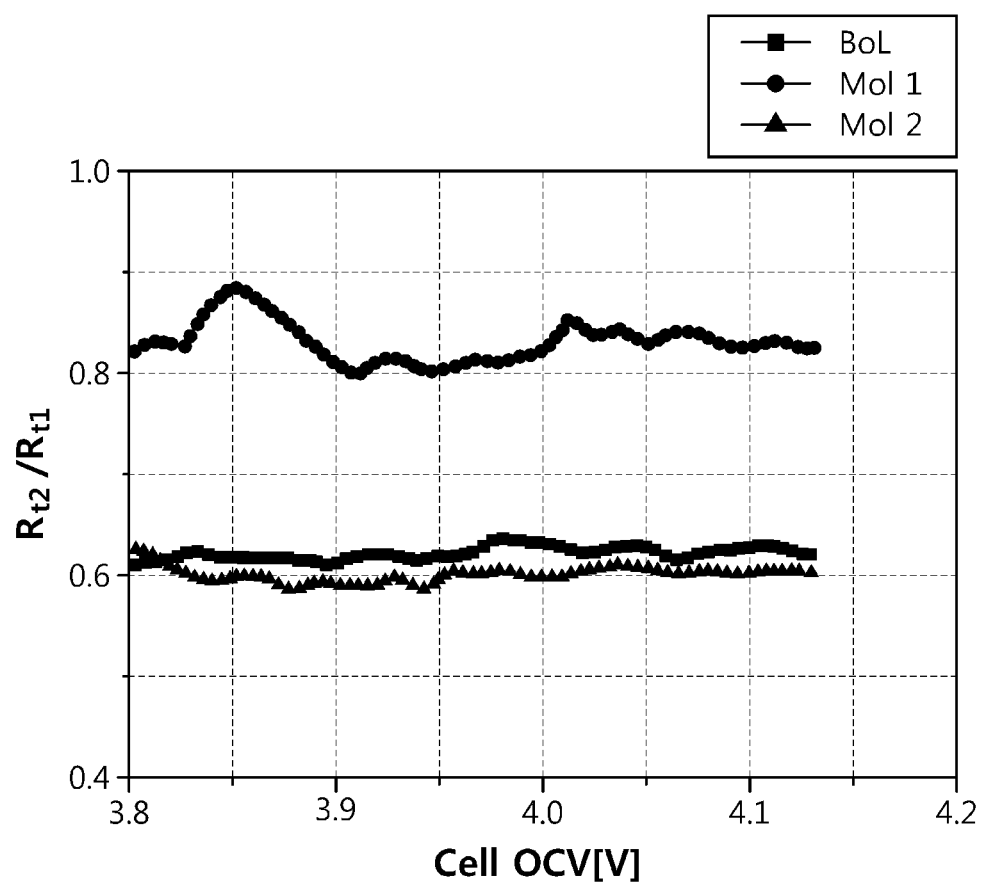
FIG. 8 is a graph in which a deterioration diagnosing resistance ratio $R_{t2,k}/R_{t1,k}$ of a lithium secondary battery in a MOL1 state, a deterioration diagnosing resistance ratio $R_{t2,k}/R_{t1,k}$ of a lithium secondary battery in a MOL2 state and a reference deterioration diagnosing resistance ratio $R_{t2,k,refer}/R_{t1,k,refer}$ of a lithium secondary battery in a BOL state are plotted together.

In FIG. 8, the profile represented by closed squares represents the reference deterioration diagnosing resistance ratio $R_{r2,k,refer}/R_{r1,k,refer}$, the profile represented by closed circles represents the deterioration diagnosing resistance ratio $R_{r2,k}/R_{r1,k}$ of the lithium secondary battery in a MOL1 state, and the profile represented by closed triangles represents the deterioration diagnosing resistance ratio $R_{r2,k}/R_{r1,k}$ of the lithium secondary battery in a MOL2 state.

Referring to FIGS. 7 and 8, the electrochemical reaction resistance $R_{r1,k}$ of the lithium secondary battery in a MOL1 state is not significantly changed compared to the reference value $R_{r1,refer}$, but the magnitude of the ion diffusion resistance $R_{r2,k}$ is increased over the reference values $R_{r2,refer}$ in the entire section of the deterioration diagnosing SOC. As a result, it may be found that the deterioration diagnosing resistance ratio $R_{r2,k}/R_{r1,k}$ of the lithium secondary battery in a MOL1 state is relatively larger than the reference deterioration diagnosing resistance ratio $R_{r2,k,refer}/R_{r1,k,refer}$.

In addition, the electrochemical reaction resistance $R_{r1,k}$ of the lithium secondary battery in a MOL2 state increases over the reference value $R_{r1,refer}$ in the entire section of the deterioration diagnosing SOC, and the magnitude of the ion diffusion resistance $R_{r2,k}$ is not significantly changed compared to the reference value $R_{r2,refer}$. As a result, it may be found that the deterioration diagnosing resistance ratio $R_{r2,k}/R_{r1,k}$ of the lithium secondary battery in a MOL2 state is relatively smaller than the reference deterioration diagnosing resistance ratio $R_{r2,k,refer}/R_{r1,k,refer}$.

The above result is in good agreement with the fact that the deterioration-biased electrode is a positive electrode in the case of the lithium secondary battery in a MOL1 state, and the deterioration-biased electrode is a negative electrode in the case of the lithium secondary battery in a MOL2 state.

Therefore, as disclosed above, if the type of a deterioration-biased electrode having a relatively large deterioration degree is identified out of the electrodes of the secondary battery in a MOL state and the charging/discharging operation condition to be applied in the next charging/discharging cycle is adaptively adjusted according to the type of the deterioration-biased electrode, the deterioration rate of the deterioration-biased electrode may be alleviated. Therefore, the safety of charging (especially, high-speed charging) may be improved, and the life of the secondary battery may be increased by balancing the positive electrode deterioration degree and the negative electrode deterioration degree.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic (s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. An apparatus for controlling an operation of a secondary battery using a relative deterioration degree of an electrode, comprising:
    a sensor configured to measure a voltage of the secondary battery; and
    a control unit operatively coupled to the sensor,
    wherein the control unit is configured to:
    receive the measured voltage of the secondary battery from the sensor in response to a current flowing through the secondary battery, the current including a charging/discharging section and a rest section,
    determine an electrochemical reaction resistance from a voltage change amount measured during a preset initial time in the charging/discharging section and determine an ion diffusion resistance from a voltage change amount measured during a remaining time in the charging/discharging section,
    determine a deterioration-biased electrode by comparing a deterioration diagnosing resistance ratio, which is a ratio of the ion diffusion resistance to the electrochemical reaction resistance, with a preset reference deterioration diagnosing resistance ratio, and
    adaptively adjust an operation condition of a charging/discharging cycle according to the determined deterioration-biased electrode.

2. The apparatus according to claim 1,
    wherein the preset initial time in the charging/discharging section is 0.1 msec to 1 sec.

3. The apparatus according to claim 1,
wherein the control unit is configured to:
determine a State Of Charge (SOC) of the secondary battery in response to the current flowing through the secondary battery; and
determine the electrochemical reaction resistance and the ion diffusion resistance according to SOC in response to the determined SOC being in a present deterioration diagnosing SOC section.

4. The apparatus according to claim 3,
wherein, according to the determined SOC of the secondary battery, an OCV profile of a negative electrode of the secondary battery has a flat section, and the deterioration diagnosing SOC section corresponds to the flat section.

5. The apparatus according to claim 4,
wherein the control unit is configured to:
determine that a positive electrode of the secondary battery is the deterioration-biased electrode in response to an average value of the deterioration diagnosing resistance ratio calculated in the deterioration diagnosing SOC section being greater than an average value of the reference deterioration diagnosing resistance ratio, and
determine that the negative electrode of the secondary battery is the deterioration-biased electrode in response to the average value of the deterioration diagnosing resistance ratio calculated in the deterioration diagnosing SOC section being smaller than the average value of the reference deterioration diagnosing resistance ratio.

6. The apparatus according to claim 4,
wherein the control unit is configured to:
determine that a positive electrode of the secondary battery is the deterioration-biased electrode in response to a ratio of a section of the deterioration diagnosing SOC section for which the deterioration diagnosing resistance ratio is greater than the reference deterioration diagnosing resistance ratio being equal to or greater than a threshold value, and
determine that the negative electrode of the secondary battery is the deterioration-biased electrode in response to a ratio of a section of the deterioration diagnosing SOC section for which the deterioration diagnosing resistance ratio is smaller than the reference deterioration diagnosing resistance ratio being equal to or greater than the threshold value.

7. The apparatus according to claim 3,
wherein, according to the determined SOC of the secondary battery, an OCV profile of a positive electrode of the secondary battery has a flat section, and the deterioration diagnosing SOC section corresponds to the flat section.

8. The apparatus according to claim 7,
wherein the control unit is configured to:
determine that a negative electrode of the secondary battery is the deterioration-biased electrode in response to an average value of the deterioration diagnosing resistance ratio calculated in the deterioration diagnosing SOC section being greater than an average value of the reference deterioration diagnosing resistance ratio, and
determine that the positive electrode of the secondary battery is the deterioration-biased electrode in response to the average value of the deterioration diagnosing resistance ratio calculated in the deterioration diagnosing SOC section being smaller than the average value of the reference deterioration diagnosing resistance ratio.

9. The apparatus according to claim 7,
wherein the control unit is configured to:
determine that negative electrode of the secondary battery is the deterioration-biased electrode in response to a ratio of a section of the deterioration diagnosing SOC section for which the deterioration diagnosing resistance ratio is greater than the reference deterioration diagnosing resistance ratio being equal to or greater than a threshold value, and
determine that the positive electrode of the secondary battery is the deterioration-biased electrode in response to a ratio of a section of the deterioration diagnosing SOC section for which the deterioration diagnosing resistance ratio is smaller than the reference deterioration diagnosing resistance ratio being equal to or greater than the threshold value.

10. The apparatus according to claim 3,
wherein the control unit is configured to:
in response to the deterioration-biased electrode being a positive electrode, adjust at least one operation condition selected from a charging cutoff voltage, a discharging cutoff voltage, a rest section of the current or a C-rate of the current according to a deviation between: (i) an average value of the deterioration diagnosing resistance ratio determined for each SOC in the preset deterioration diagnosing SOC section; and (ii) an average value of the reference deterioration diagnosing resistance ratio preset for each SOC, and
in response to the deterioration-biased electrode being a negative electrode, adjust the at least one operation condition selected from the charging cutoff voltage, the discharging cutoff voltage, the rest section of the current or the C-rate of the current according to the deviation between the average value of the deterioration diagnosing resistance ratio determined for each SOC in the preset deterioration diagnosing SOC section; and (ii) the average value of the reference deterioration diagnosing resistance ratio preset for each SOC.

11. A battery management system, comprising the apparatus according to claim 1.

12. An electric driving mechanism, comprising the apparatus according to claim 1.

13. A method for controlling an operation of a secondary battery using a relative deterioration degree of an electrode, comprising:
(a) measuring a voltage of the secondary battery in response to a current flowing through the secondary battery, the current including a charging/discharging section and a rest section;
(b) determining an electrochemical reaction resistance from a voltage change amount measured during a preset initial time in the charging/discharging section and determining an ion diffusion resistance from a voltage change amount measured during a remaining time in the charging/discharging section;
(c) determining a deterioration-biased electrode by comparing a deterioration diagnosing resistance ratio, which is a ratio of the ion diffusion resistance to the electrochemical reaction resistance, with a preset reference deterioration diagnosing resistance ratio; and
(d) adaptively adjusting an operation condition of a charging/discharging cycle according to the determined deterioration-biased electrode.

14. The method according to claim 13,
wherein the preset initial time in the charging/discharging section is 0.1 msec to 1 sec.

15. The method according to claim 13, further comprising the step of determining a State Of Charge (SOC) of the secondary battery in response to the current flowing through the secondary battery,
wherein the steps (b) to (d) are implemented in response to the determined SOC being in a present deterioration diagnosing SOC section.

16. The method according to claim 15,
wherein, according to the determined SOC of the secondary battery, an OCV profile of a negative electrode of the secondary battery has a flat section, and the deterioration diagnosing SOC section corresponds to the flat section.

17. The method according to claim 16,
wherein determining a deterioration-biased electrode comprises:
determining that a positive electrode of the secondary battery is the deterioration-biased electrode in response to an average value of the deterioration diagnosing resistance ratio calculated in the deterioration diagnosing SOC section being greater than an average value of the reference deterioration diagnosing resistance ratio, and
determining that the negative electrode of the secondary battery is the deterioration-biased electrode in response to the average value of the deterioration diagnosing resistance ratio calculated in the deterioration diagnosing SOC section being smaller than the average value of the reference deterioration diagnosing resistance ratio.

18. The method according to claim 16,
wherein determining a deterioration-biased electrode comprises:
determining that a positive electrode of the secondary battery is the deterioration-biased electrode in response to a ratio of a section of the deterioration diagnosing SOC section for which the deterioration diagnosing resistance ratio is greater than the reference deterioration diagnosing resistance ratio is equal to or greater than a threshold value, and
determining that the negative electrode of the secondary battery is the deterioration-biased electrode in response to a ratio of a section of the deterioration diagnosing SOC section for which the deterioration diagnosing resistance ratio is smaller than the reference deterioration diagnosing resistance ratio being equal to or greater than the threshold value.

19. The method according to claim 15,
wherein, according to the determined SOC of the secondary battery, an OCV profile of a positive electrode of the secondary battery has a flat section, and the deterioration diagnosing SOC section corresponds to the flat section.

20. The method according to claim 19,
wherein determining a deterioration-biased electrode comprises:
determining that a negative electrode of the secondary battery is the deterioration-biased electrode in response to an average value of the deterioration diagnosing resistance ratio calculated in the deterioration diagnosing SOC section being greater than an average value of the reference deterioration diagnosing resistance ratio, and
determining that the positive electrode is the deterioration-biased electrode in response to the deterioration diagnosing resistance ratio calculated in the deterioration diagnosing SOC section being smaller than the average value of the reference deterioration diagnosing resistance ratio.

21. The method according to claim 19,
wherein determining a deterioration-biased electrode comprises:
determining that a negative electrode of the secondary battery is the deterioration-biased electrode in response to a ratio of a section of the deterioration diagnosing SOC section for which the deterioration diagnosing resistance ratio is greater than the reference deterioration diagnosing resistance ratio being equal to or greater than a threshold value, and
determining that the positive electrode is the deterioration-biased electrode in response to a ratio of a section of the deterioration diagnosing SOC section for which the deterioration diagnosing resistance ratio is smaller than the reference deterioration diagnosing resistance ratio being equal to or greater than the threshold value.

22. The method according to claim 15,
wherein adaptively adjusting an operation condition of a charging/discharging cycle comprises:
in response to the deterioration-biased electrode being a positive electrode, adjusting at least one operation condition selected from a charging cutoff voltage, a discharging cutoff voltage, a rest section of the current or a C-rate of the current according to a deviation between: (i) an average value of the deterioration diagnosing resistance ratio determined for each SOC in the preset deterioration diagnosing SOC section; and (ii) an average value of the reference deterioration diagnosing resistance ratio preset for each SOC, and
in response to the deterioration-biased electrode being a negative electrode, adjusting at least one operation condition selected from the charging cutoff voltage, the discharging cutoff voltage, the rest section of the current or the C-rate of the current according to a deviation between: (i) the average value of the deterioration diagnosing resistance ratio determined for each SOC in the preset deterioration diagnosing SOC section; and (ii) the average value of the reference deterioration diagnosing resistance ratio preset for each SOC.

* * * * *